US010665812B2

(12) United States Patent
Ajiki et al.

(10) Patent No.: US 10,665,812 B2
(45) Date of Patent: May 26, 2020

(54) ORGANIC EL DISPLAY PANEL AND METHOD FOR PRODUCING ORGANIC EL DISPLAY PANEL

(71) Applicant: JOLED INC., Tokyo (JP)

(72) Inventors: Hiroyuki Ajiki, Tokyo (JP); Masaki Nishimura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/892,537

(22) Filed: Feb. 9, 2018

(65) Prior Publication Data

US 2018/0233691 A1    Aug. 16, 2018

(51) Int. Cl.
| H01L 51/56 | (2006.01) |
| H01L 51/52 | (2006.01) |
| H01L 27/32 | (2006.01) |
| H01L 51/00 | (2006.01) |

(52) U.S. Cl.
CPC ...... *H01L 51/5212* (2013.01); *H01L 27/3276* (2013.01); *H01L 27/3279* (2013.01); *H01L 51/001* (2013.01); *H01L 51/0021* (2013.01); *H01L 51/56* (2013.01); *H01L 27/3211* (2013.01); *H01L 27/3246* (2013.01); *H01L 27/3248* (2013.01); *H01L 51/5221* (2013.01); *H01L 2227/323* (2013.01); *H01L 2251/5315* (2013.01)

(58) Field of Classification Search
CPC combination set(s) only.
See application file for complete search history.

(56) References Cited

U.S. PATENT DOCUMENTS

| 5,443,922 A | 8/1995 | Nishizaki et al. |
| 2002/0158835 A1 | 10/2002 | Kobayashi et al. |
| 2011/0121346 A1 | 5/2011 | Yamada et al. |
| 2014/0151672 A1 | 6/2014 | Yamada et al. |

(Continued)

FOREIGN PATENT DOCUMENTS

| JP | 05-163488 A | 6/1993 |
| JP | 2002-318556 A | 10/2002 |

(Continued)

OTHER PUBLICATIONS

Non-Final Office Action for U.S. Appl. No. 15/898,311, dated Oct. 3, 2018, 31 pages.

*Primary Examiner* — Fernando L Toledo
*Assistant Examiner* — Valerie N Newton
(74) *Attorney, Agent, or Firm* — Chip Law Group

(57) ABSTRACT

There is provided an organic EL display panel having a substrate, a plurality of pixel electrodes arranged in a matrix pattern on the substrate, and a light-emitting layer formed on each pixel electrode. The organic EL display panel includes a power supply auxiliary electrode layer securing an electrode forming region which extends in a row direction or a column direction on at least one of gaps between pixel electrodes adjoining to each other on the substrate in the row or column direction and being formed so as not to come into contact with the pixel electrode adjoining to the electrode forming region, a functional layer configured to be formed so as to extend over the light-emitting layer and the power supply auxiliary electrode layer, and a common electrode layer configured to be formed so as to continuously extend on the functional layer.

6 Claims, 14 Drawing Sheets

(56) References Cited

U.S. PATENT DOCUMENTS

| | | |
|---|---|---|
| 2016/0211488 A1 | 7/2016 | Nirengi et al. |
| 2017/0033166 A1 | 2/2017 | Shim et al. |
| 2018/0190934 A1 | 7/2018 | Choi et al. |
| 2018/0358573 A1* | 12/2018 | Maeda ................ H01L 51/5036 |

FOREIGN PATENT DOCUMENTS

| | | |
|---|---|---|
| JP | 2008-135325 A | 6/2008 |
| JP | 2010-056075 A | 3/2010 |
| JP | 2010-272353 A | 12/2010 |
| JP | 2013-054979 A | 3/2013 |
| JP | 2016-072118 A | 5/2016 |

* cited by examiner

ORGANIC EL DISPLAY PANEL AND METHOD FOR PRODUCING ORGANIC EL DISPLAY PANEL

CROSS REFERENCE TO RELATED APPLICATIONS

This application claims priority benefit of Japanese Patent Application No. JP 2017-023351 filed in the Japan Patent Office on Feb. 10, 2017. Each of the above-referenced applications is hereby incorporated herein by reference in its entirety.

BACKGROUND

The present disclosure relates to an organic electro luminescence (EL) display panel and a method for producing the organic EL display panel, the organic EL display panel being composed of organic EL elements which rely on the electroluminescence of an organic material.

As the display panel for the display apparatus such as digital television, an organic EL display panel having organic EL elements arranged in a matrix pattern on a substrate has recently put to practical use.

In the organic EL display panel, a light-emitting layer of each organic EL element and an organic EL element adjoining thereto are separated from each other by an insulation layer composed of an insulating material. By contrast, the organic EL display panel for color display has organic EL elements each composed of sub-pixels emitting red (R), green (G), and blue (B) colors, such that the adjoining sub-pixels of RGB combined together constitute the unit pixel for color display.

The organic EL element has a basic structure in which a light-emitting layer containing an organic light-emitting material is disposed between paired electrodes. To drive the organic EL element, the paired electrodes are energized so that the light-emitting layer emits light as the result of recombination of holes and electrons injected thereinto.

There is an organic EL element of top emission type having an element structure in which a pixel electrode, an organic layer (including a light-emitting layer), and a common electrode are sequentially formed on a substrate. The light-emitting layer emits light which is reflected by the pixel electrode made of a light-reflecting material and radiates upward through the common electrode made of a light-transmitting material.

The common electrode is usually formed all over the substrate. This structure poses a problem of voltage drop that occurs across the common electrode having a high electrical resistance at a part far from a power supply unit. This voltage drop results in an insufficient current supply, which in turn decreases the light-emission efficiency and eventually causes uneven luminance.

In order to address this problem, there has been proposed an idea of providing an auxiliary electrode that reduces the resistance of the common electrode (see Japanese Patent Laid-open No. 2002-318556, for example). It discloses a structure composed of the auxiliary electrode and the pixel electrode which are formed on the same level, with the auxiliary electrode and the pixel electrode being electrically isolated from each other but being electrically connected to the common electrode.

SUMMARY

However, the conventional process mentioned above has a disadvantage of requiring vapor deposition through a mask in forming the electron transport layer in the area excluding the auxiliary electrodes, the electron transport layer being on the light-emitting layer, which is one of the organic layers. This leads to an increased production cost.

It is desirable to provide an organic EL display panel and a method for producing the organic EL display panel. The organic EL display panel is configured with its simple production process and its improved light-emission efficiency and a reduction in uneven luminance which result from reduction in electrical resistance across the connection between the electrical common electrode and the auxiliary electrode.

One embodiment of the present disclosure covers an organic EL display panel having a substrate, a plurality of pixel electrodes arranged in a matrix pattern on the substrate, and a light-emitting layer containing an organic light-emitting material which is formed on each pixel electrode. The organic EL display panel includes a power supply auxiliary electrode layer, a functional layer, and a common electrode layer. The power supply auxiliary electrode layer secures an electrode forming region which extends in a row direction or a column direction on at least one of gaps between pixel electrodes adjoining to each other on the substrate in the row or column direction and is formed so as not to come into contact with the pixel electrode adjoining to the electrode forming region. The functional layer is so formed as to extend over the light-emitting layer and the power supply auxiliary electrode layer. The common electrode layer is so formed as to continuously extend on the functional layer. The power supply auxiliary electrode layer has a recess denting toward the substrate. The functional layer has a nick at a position on an inside wall of the recess of the power supply auxiliary electrode layer. The common electrode layer is in direct contact with the power supply auxiliary electrode layer which exposes itself through the nick in the functional layer.

The organic EL display panel according to one embodiment of the present disclosure covers an organic EL display panel which is configured with its simple production process and its improved light-emission efficiency and a reduction in uneven luminance which result from reduction in electrical resistance across the electrical connection between the common electrode and the auxiliary electrode.

DETAILED DESCRIPTION OF THE PREFERRED EMBODIMENTS

Outline of Embodiments for Present Disclosure

Figure 1:
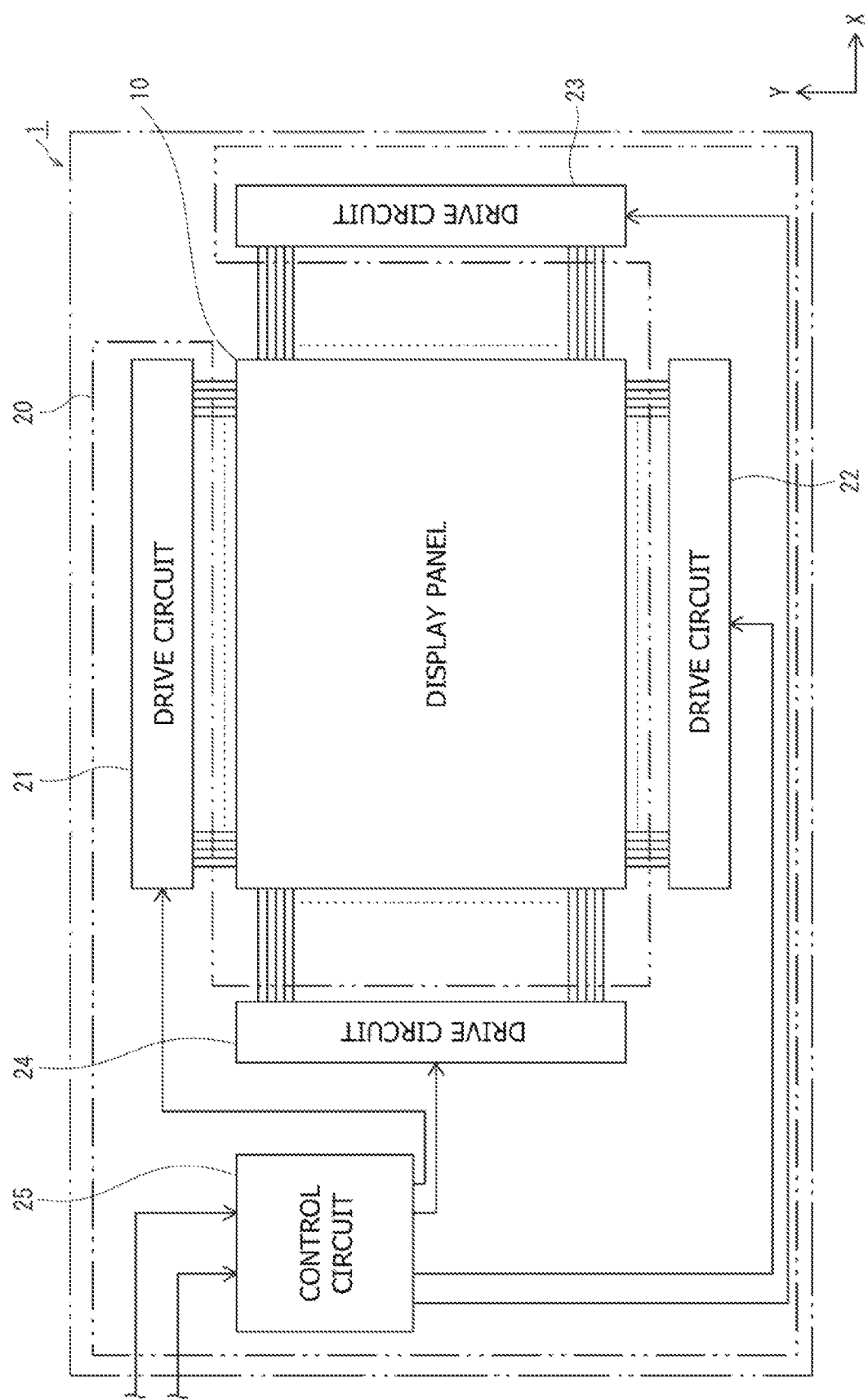
FIG. 1 is a schematic block diagram illustrating a circuit structure of an organic EL display apparatus pertaining to an embodiment.

An embodiment A1 of the present disclosure covers an organic EL display panel having a substrate, a plurality of pixel electrodes arranged in a matrix pattern on the substrate, and a light-emitting layer containing an organic light-emitting material which is formed on each pixel electrode. The organic EL display panel includes a power supply auxiliary electrode layer, a functional layer, and a common electrode layer. The power supply auxiliary electrode layer secures an electrode forming region which extends in a row direction or a column direction on at least one of gaps between pixel electrodes adjoining to each other on the substrate in the row or column direction and is formed so as not to come into contact with the pixel electrode adjoining to the electrode forming region. The functional layer is so formed as to extend over the light-emitting layer and the power supply auxiliary electrode layer. The common electrode layer is so formed as to continuously extend on the functional layer. The power supply auxiliary electrode layer has a recess denting toward the substrate. The functional layer has a nick or a thinned part at a position on an inside wall of the recess of the power supply auxiliary electrode layer. The common electrode layer is in direct contact with the power supply auxiliary electrode layer which exposes itself through the nick in the functional layer and is electrically connected to the power supply auxiliary electrode layer at that part where the functional layer is thinned, with resistance there lower than the other part of the functional layer.

The organic EL display panel constructed as mentioned above can be produced by simple production processes. It is configured with a reduced electrical resistance at the electrical connection between the common electrode and the auxiliary electrode, an improved light-emission efficiency, and a reduction in uneven luminance.

An embodiment A2 of the present disclosure covers the organic EL display panel according to the embodiment A1, in which the electrode forming region on the substrate has a recess formed thereon, and the recess of the power supply auxiliary electrode layer is formed along the recess of the substrate.

The above-mentioned structure makes it possible to employ the vapor phase growth method to form the auxiliary electrode layer having a recess along the recess formed on the substrate. Moreover, the above-mentioned structure makes it possible to control the inclined angle of the side wall of the recess to be formed on the substrate. This permits the contact surface of the recess to be formed on the auxiliary electrode layer with an optimal inclined angle.

An embodiment A3 of the present disclosure covers the organic EL display panel according to the embodiment A1 or A2, in which the inner wall of the recess of the power supply auxiliary electrode layer and the upper surface of the substrate intersect with each other at an angle of 75° to 120°.

This structure makes it possible to form on the auxiliary electrode layer a recess having a contact surface inclined at an optimal angle for the functional layer to give rise to a break at the step. Thus it is possible to realize direct contact between the auxiliary electrode layer and the common electrode layer by a simple production process that does not need vapor deposition through a mask.

An embodiment A4 of the present disclosure covers a method for producing an organic EL display panel having a substrate, a plurality of pixel electrodes arranged in a matrix pattern on the substrate, and a light-emitting layer containing an organic light-emitting material which is formed on each pixel electrode. The method includes a step of securing an electrode forming region which extends in a row direction or a column direction on at least one of gaps between pixel electrodes adjoining to each other on the substrate in the row or column direction and forming by a vapor phase growth method a power supply auxiliary electrode layer having a recess denting toward the substrate in such a manner that the power supply auxiliary electrode layer is not in contact with the pixel electrode adjoining to the electrode forming region, a step of forming by a vacuum deposition method a functional layer extending over the light-emitting layer and the power supply auxiliary electrode layer in such a way that the functional layer has a nick or a thinned part at a position on an inside wall of the recess of the power supply auxiliary electrode layer, and a step of forming by a sputtering method or a chemical vapor deposition (CVD) method a common electrode layer in such a way that it continuously extends on the functional layer, it is in direct contact with the power supply auxiliary electrode layer which exposes itself through the nick in the functional layer, and it is electrically connected to the power supply auxiliary electrode layer at that part where the functional layer is thinned, with resistance there lower than the other part of the functional layer.

This structure makes it possible to produce by a simple production process an organic EL display panel which is configured with a reduced electrical resistance at the electrical connection between the common electrode and the auxiliary electrode, an improved light-emission efficiency, and a reduction in uneven luminance.

An embodiment A5 of the present disclosure covers the method for producing an organic EL display panel according to the embodiment A4, in which the step of preparing the substrate is followed by a step of forming a recess in the electrode forming region and the step of forming the power supply auxiliary electrode layer forms a recess of the power supply auxiliary electrode layer along the recess on the substrate.

This method makes it possible to form by a vapor phase growth method the auxiliary electrode layer which has a recess along the recess formed on the substrate. Moreover, the above-mentioned method makes it possible to control the inclined angle of the side wall of the recess to be formed on the substrate. This permits the contact surface of the recess to be formed on the auxiliary electrode layer with an optimal inclined angle.

An embodiment A6 of the present disclosure covers the method for producing an organic EL display panel according to the embodiment A5, in which the step of forming a recess in the electrode forming region is performed in such a way that the inner wall of the recess and the upper surface of the substrate intersect with each other at an angle of 75° to 120°.

This method makes it possible to form on the auxiliary electrode layer a recess having a contact surface inclined at an optimal angle for the functional layer to give rise to a break at the step. Thus it is possible to realize direct contact between the auxiliary electrode layer and the common electrode layer by a simple production process that does not need vapor deposition through a mask.

Embodiment 1

1.1 Circuit Structure of Display Apparatus 1

An organic EL display apparatus 1 (referred to as "display apparatus 1" hereinafter) pertaining to Embodiment 1 has the circuit structure (illustrated in FIG. 1) which is described below.

As FIG. 1 illustrates, the display apparatus 1 includes an organic EL display panel 10 (referred to as "display panel 10" hereinafter) and a drive/control circuit 20 connected thereto.

The display panel 10 is an organic EL panel which relies on the electroluminescence of an organic material. It includes a plurality of organic EL elements which are arranged in a matrix pattern, for example. The drive/control circuit 20 includes four drive circuits 21 to 24 and one control circuit 25.

The display apparatus 1 may have the drive/control circuit 20 for the display panel 10 arranged in various ways other than those illustrated in FIG. 1.

1.2 Circuit Structure of Display Panel 10

The display panel 10 has a display region which includes a plurality of unit pixels 100e arranged in a matrix pattern. Each unit pixel 100e includes three organic EL elements or three sub-pixels 100se emitting light in three colors of R, G, and B. Each sub-pixel 100se has a circuit structure as described below with reference to FIG. 2.

The display panel 10 used in the display apparatus 1 includes organic EL elements 100, each corresponding to the sub-pixels 100se. The organic EL element 100 has the circuit structure as illustrated in FIG. 2.

Figure 2:
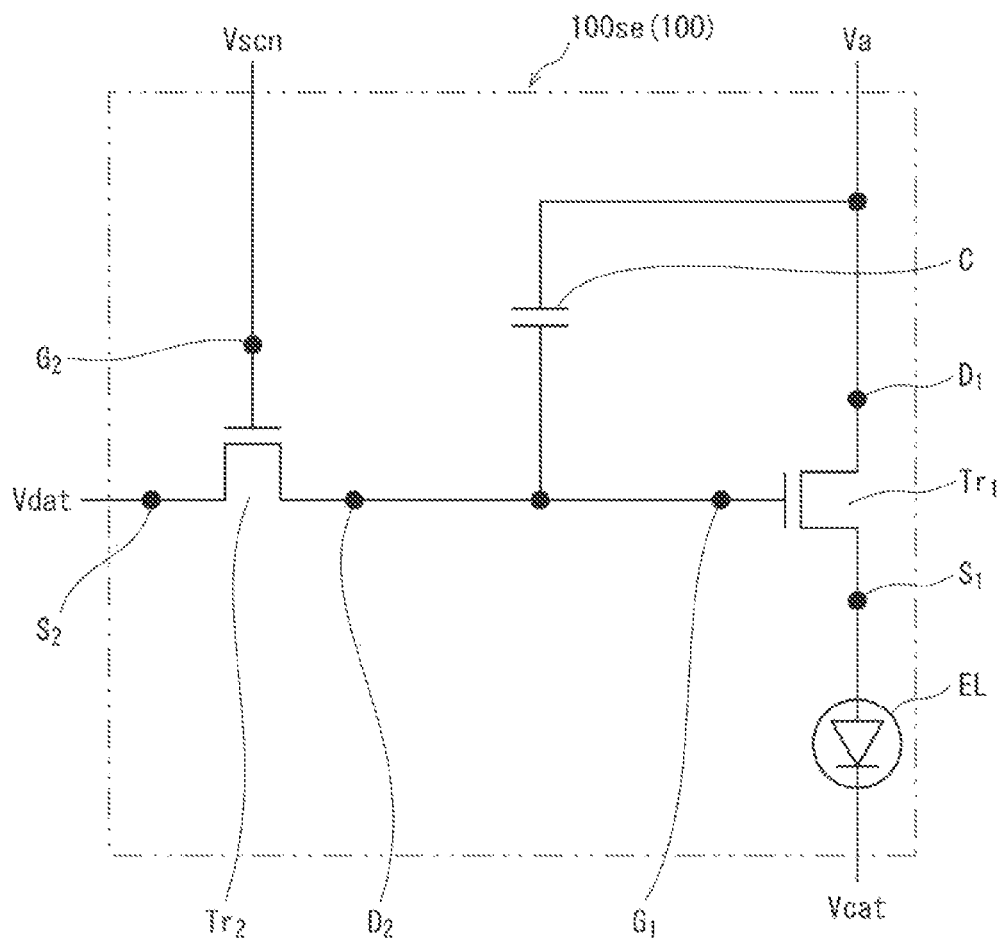
FIG. 2 is a schematic diagram illustrating a circuit structure in each sub-pixel in an organic EL display panel used in the organic EL display apparatus.

As FIG. 2 illustrates, the display panel 10 pertaining to this embodiment has the sub-pixels 100se, each of which includes two transistors Tr1 and Tr2, one capacitor C, and an organic EL element part EL functioning as a light-emitting unit. The transistor Tr1 is a drive transistor and the transistor Tr2 is a switching transistor.

The switching transistor Tr2 has its gate G2 connected to a scan line Vscn and its source S2 connected to a data line Vdat. Moreover, the switching transistor Tr2 has its drain D2 connected to a gate G1 of the drive transistor Tr1.

The drive transistor Tr1 has its drain D1 connected to the power source line Va and has its source S1 connected to a pixel electrode layer (anode) of the organic EL element part EL. The organic EL element part EL has its common electrode layer (cathode) connected to a ground line Vcat.

Incidentally, the capacitor C has its first terminal connected to the drain D2 of the switching transistor Tr2 and the gate G1 of the drive transistor Tr1, and the capacitor C also has its second terminal connected to a power source line Va.

The display panel 10 has a pixel region in which the unit pixels 100e are arranged. Each unit pixel 100e includes a plurality of, for example, three sub-pixels 100se adjoining to one another emitting light in R, G, and B colors. Each sub-pixel 100se is connected to the scan line Vscn (extending from somewhere outside the display panel 10) through the gate line extending from the gate G2. Likewise, each sub-pixel 100se is connected to the data line Vdat (extending from somewhere outside the display panel 10) through the power source line extending from the source S2.

Each sub-pixel 100se has its power source line Va and its ground line Vcat connected respectively to a power source line and a ground line of the display apparatus 1.

1.3 Overall Structure of Display Panel 10

In what follows, the display panel 10 pertaining to the present embodiment will be described with reference to FIG. 3, which is a schematic diagram drawn with a somewhat unreal scale.

Figure 3:
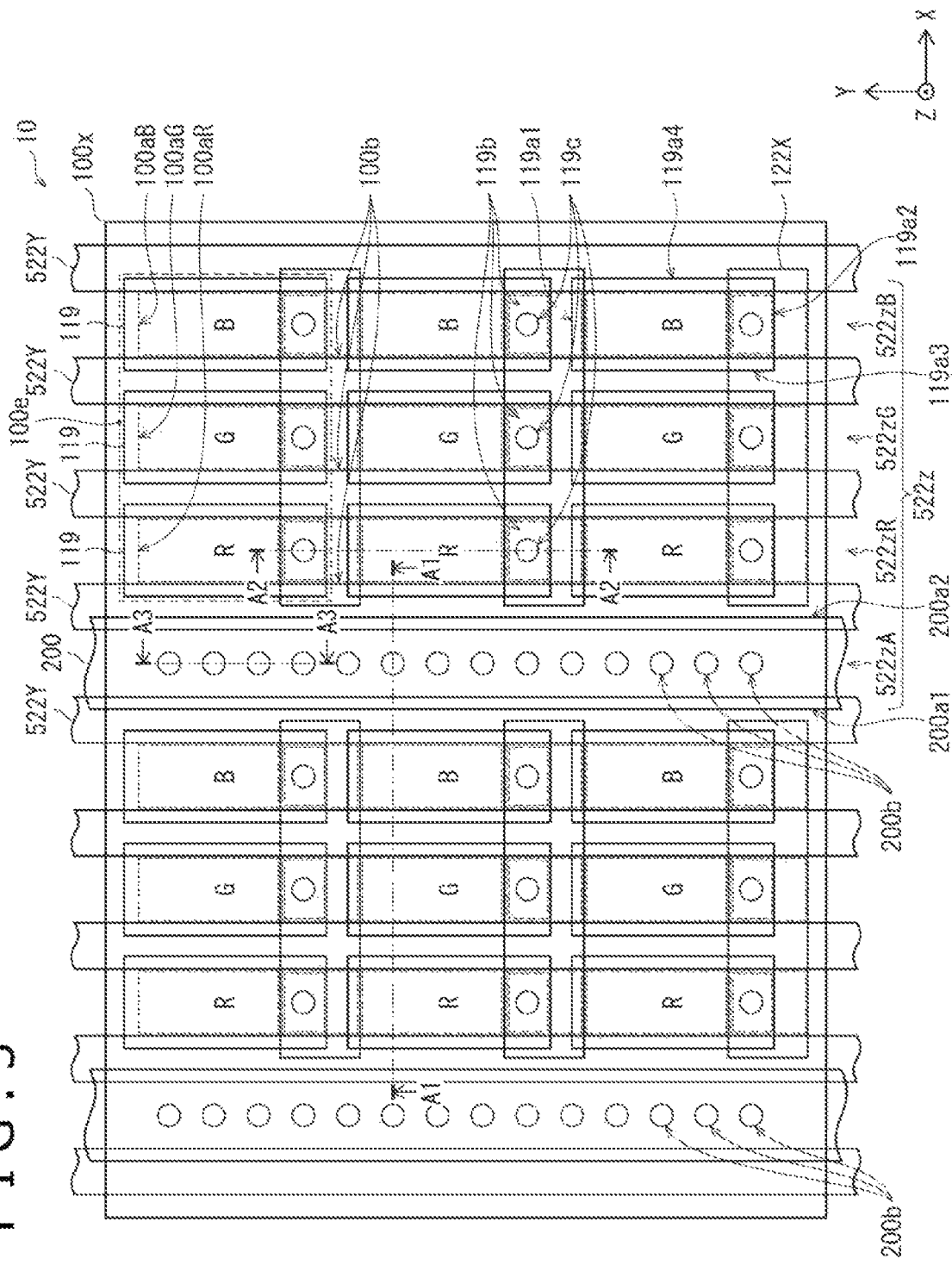
FIG. 3 is a schematic plan view illustrating part of the organic EL display panel.

FIG. 3 is a schematic plan view illustrating part of the display panel pertaining to the embodiment.

The display panel 10 is an organic EL display panel that relies on the electroluminescence of an organic compound. It includes a substrate 100x supporting thin film transistors (TFTs) thereon and the plurality of organic EL elements 100 arranged thereon in a matrix pattern. Thus, the display panel 10 is that of top emission type which emits light from the upper plane. In the present specification, the X-direction, Y-direction, and Z-direction in FIG. 3 correspond respectively to the row direction, the column direction, and the thickness direction of the display panel 10.

The display region of the display panel 10 includes the unit pixels 100e (arranged in a matrix pattern) each including the plurality of organic EL elements 100. Each unit pixel 100e includes the region which emits light with the help of an organic compound. The light-emitting region includes three self-light emitting regions 100a, one being 100aR (emitting red light), one being 100aG (emitting green light), and one being 100aB (emitting blue light). They will be collectively referred to as 100a if they are not discriminated. One set of three sub-pixels 100se, corresponding to the self-light emitting regions 100aR, 100aG, and 100aB arranged in the row direction, forms the unit pixel 100e for color display. If they are discriminated, the three sub-pixels 100se will be designated as a blue sub-pixel 100seB, a green sub-pixel 100seG, and a red sub-pixel 100seR.

The display panel 10 has a plurality of pixel electrode layers 119 which are arranged on the substrate 100x in a matrix pattern a predetermined distance apart from each other in the row and column directions. The pixel electrode layer 119 is rectangular in shape viewed from top, and it is made of a light-reflecting material. The three pixel electrode layers 119 arranged side by side in the row direction correspond individually to the three self-light emitting regions 100aR, 100aG, and 100aB arranged side by side in the row direction.

The display panel 10 has a plurality of auxiliary electrode layers 200 which are formed on the substrate 100x. The auxiliary electrode layer 200 continuously extends in the column direction along the space between the adjoining unit pixels 100e. It is made of the same light-reflecting material as used for the pixel electrode layer 119. The upper surface of the auxiliary electrode layer 200 has a plurality of connection recesses 200b (contact holes) for connection between the auxiliary electrode layer 200 and a common electrode layer 125 to be mentioned later.

The gap between the adjoining pixel electrode layers 119 and the gap between the pixel electrode layer 119 and the auxiliary electrode layer 200 which adjoin to each other are filled with a bank (insulation layer) extending straight along the gap. Therefore, the pixel electrode layer 119 is insulated from the pixel electrode layer 119 adjoining thereto and also from the auxiliary electrode layer 200 adjoining thereto. There are a plurality of column banks 522Y extending in the column direction (or the Y-direction in FIG. 3). Each of the column banks 522Y is formed above that region on the substrate 100x which is held between row direction outer edges 119a3 and 119a4 of the two pixel electrode layers 119 adjoining to each other in the row direction, and which is held between respectively the row direction outer edges 119a3 and 119a4 of the pixel electrode layer 119 and the outer edges 200a1 and 200a2 of the auxiliary electrode layers 200 adjoining to each other in the row direction. Therefore, the self-light emitting region 100a has its row direction outer edges defined by the row direction outer edges of the column bank 522Y.

On the other hand, there are a plurality of row banks 122X extending in the row direction (or the X-direction in FIG. 3) which are each formed above that region on the substrate 100x which is held between column direction outer edges 119a1 and 119a2 of the two pixel electrode layers 119 adjoining to each other in the column direction. The region where the row bank 122X is formed defines a non-self-light emitting region 100b, because it prevents the organic electroluminescence from occurring in a light-emitting layer 123 above the pixel electrode layer 119. Consequently, the self-light emitting region 100a has its outer edge in the column direction defined by the column direction outer edge of the row bank 112X.

Let the space between the adjoining column banks 522Y be defined as the gap 522z. Then, the gap 522z holds therein a red color gap 522zR corresponding to the self-light emitting region 100aR, a green color gap 522zG corresponding to the self-light emitting region 100aG, a blue color gap 522zB corresponding to the self-light emitting region 100aB, and an auxiliary gap 522zA corresponding to the region in which the auxiliary electrode layer 200 is arranged (the gap 522zR, the gap 522zG, the gap 522zB, and the gap 522zA will be collectively referred to as the gap 522z unless they are discriminated from one another). This suggests that the display panel 10 includes a large number of the column banks 522Y and a large number of the gaps 522z which are arranged alternately.

The display panel 10 has the self-light emitting regions 100a and the non-self-light emitting regions 100b arranged alternately in the column direction along the gap 522zR, the gap 522zG, and the gap 522zB. The non-self-light emitting region 100b has a connection recess 119c (contact hole) for connection between the pixel electrode layer 119 and the source S1 of the TFT and it also has a contact region 119b (contact window) on the pixel electrode layer 119 for electrical connection to the pixel electrode layer 119.

One sub-pixel 100se has therein the column bank 522Y extending in the column direction and the row bank 122X extending in the row direction which cross each other at right angles. The self-light emitting region 100a extends in the column direction and exists between the row bank 122X and the row bank 122X.

1.4 Structure of Each Part of Display Panel 10

Figure 4:
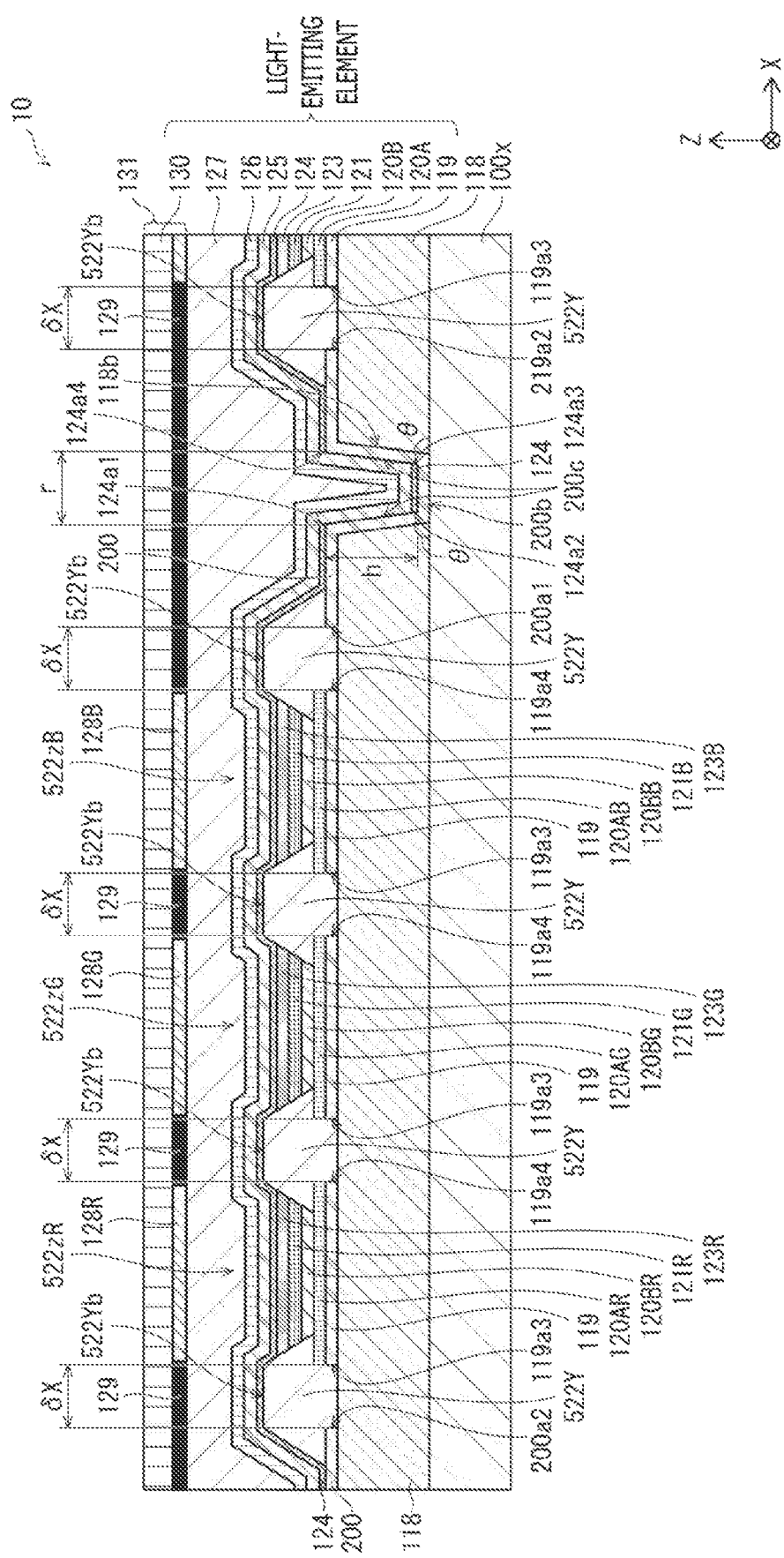
FIG. 4 is a schematic sectional view taken along a line A1-A1 in FIG. 3.
Figure 5:
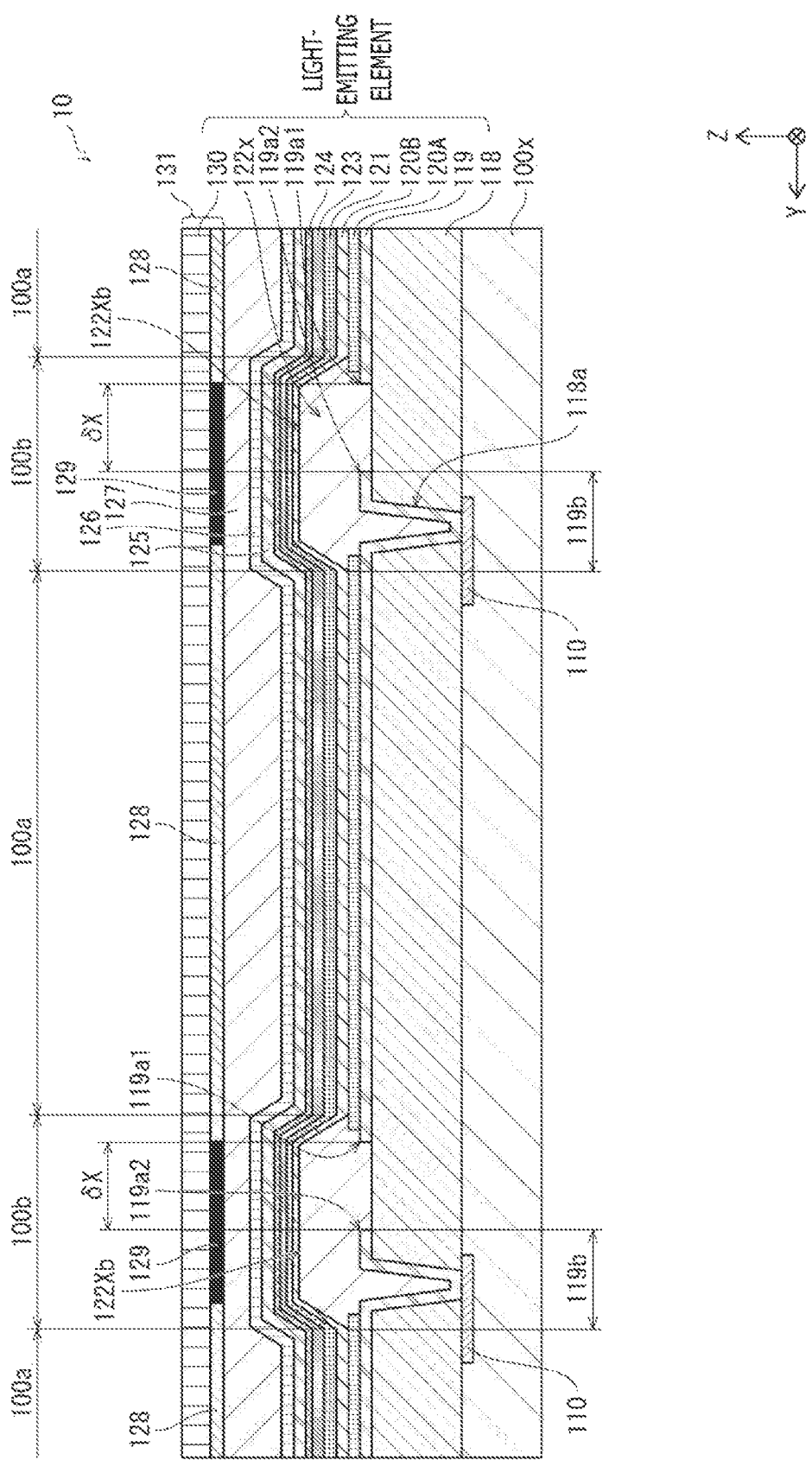
FIG. 5 is a schematic sectional view taken along a line A2-A2 in FIG. 3.
Figure 6:
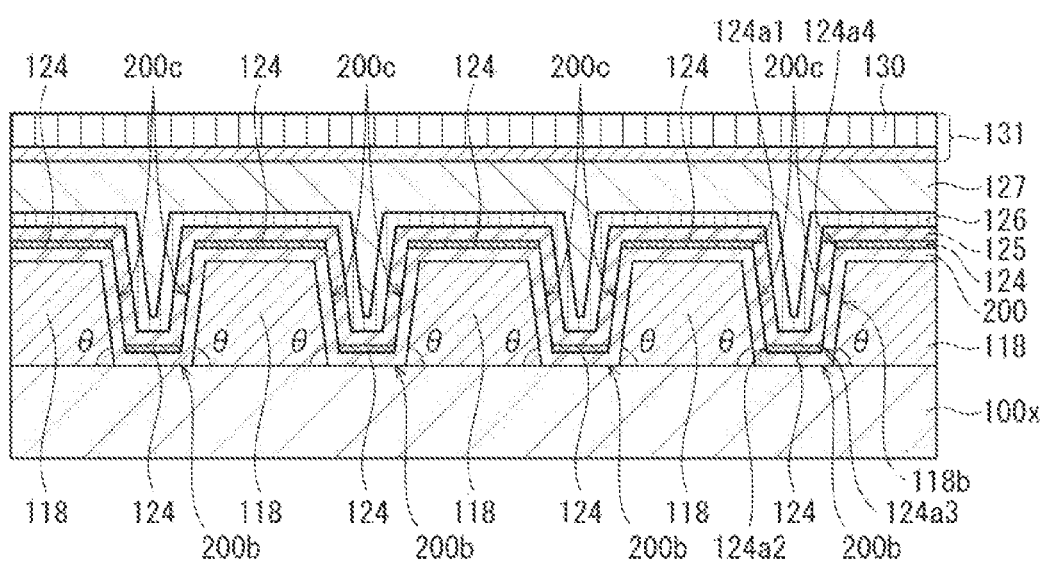
FIG. 6 is a schematic sectional view taken along a line A3-A3 in FIG. 3.

The display panel 10 has the organic EL element 100 which is constructed as illustrated in FIGS. 4, 5 and 6. FIG. 4 is a schematic sectional view taken along a line A1-A1 in FIG. 3. FIG. 5 is a schematic sectional view taken along a line A2-A2 in FIG. 3. FIG. 6 is a schematic sectional view taken along a line A3-A3 in FIG. 3.

The display panel 10 pertaining to the present embodiment includes a substrate (TFT substrate) having thin film transistors formed thereon and the organic EL element parts formed on the substrate. The substrate exists below in the Z-axis.

1.4.1 Substrate
(1) Substrate 100x

The substrate 100x is a supporting member of the display panel 10. It includes a base (not illustrated) and a TFT layer (not illustrated) formed on the base.

The base is a supporting member of the display panel 10. It is a flat plate. The base is made of any electrically insulating material, such as glass, resin, semiconductor, and metal coated with an insulation layer.

The TFT layer includes a plurality of TFTs formed on the upper surface of the base and a plurality of wiring including wiring 110. The TFT electrically connects the pixel electrode layer 119 corresponding to itself and an external power source in response to a drive signal coming from an external circuit of the display panel 10. It takes on a multilayer structure such as electrodes, semiconductor layers, and insulator layers. The wiring 110 electrically connect together the TFT, the pixel electrode layer 119, the external power source, and the external circuit. The wiring 110 is connected to the source S1 of the TFT.

(2) Interlayer Insulation Layer 118

The base and the TFT layer have the interlayer insulation layer 118 formed on the upper surface thereof. The substrate 100x has the interlayer insulation layer 118 formed on the upper surface thereof. The interlayer insulation layer 118 is intended to planarize the upper surface of the substrate 100x which is rough due to the TFT layer. The interlayer insulation layer 118 fills gaps between the wiring 110 and the TFT, thereby electrically insulating them from each other.

The interlayer insulation layer 118 has a contact hole 118a on part of the upper surface of the wiring 110 as illustrated in FIG. 5. The interlayer insulation layer 118 also has a contact hole 118b on part of the lower surface of the auxiliary electrode layer 200 as illustrated in FIGS. 4 and 6. The interlayer insulation layer 118 is preferably not thicker than 10 μm; the one thicker than this limit will suffer from thickness variation at the time of processing and experience difficulty in controlling the bottom line width. The upper limit of the film thickness is preferably equal to or less than 7 μm from the standpoint of preventing productivity from decreasing due to increase in contact. Also, the lower limit of the film thickness is preferably properly considered in view of the fact that the film thickness and the bottom line width is preferably nearly the same as the film thickness decreases. The film thickness of equal to or less than 1 μm presents difficulties in realizing the desired bottom line width due to restrictions on dissolution. The lower limit of the film thickness is usually 2 μm in the case where an ordinary exposing machine for a flat panel display is employed. Consequently, the interlayer insulation layer 118 preferably has a thickness of 1 to 10 μm, more preferably 2 to 7 μm.

1.4.2 Organic EL Element Part
(1) Pixel Electrode Layer 119

The substrate 100x has the interlayer insulation layer 118 on the upper surface thereof. The interlayer insulation layer 118 has the pixel electrode layer 119 which is formed for each of the sub-pixels 100se, as illustrated in FIGS. 4 and 5. The pixel electrode layer 119 is intended to supply carriers to the light-emitting layer 123. It also supplies holes to the light-emitting layer 123 if it functions as an anode. Since the display panel 10 is of top emission type, the pixel electrode layer 119 is capable of light reflection and is flat and square in shape. The pixel electrode layers 119 are arranged on the interlayer insulation layer 118 in the row direction with intervals δX interposed between them. The pixel electrode layers 119 are also arranged on the interlayer insulation layer 118 in the column direction at the gap 522zR, the gap 522zG, and the gap 522zB with intervals δY interposed between them. The interlayer insulation layer 118 has the contact hole 118a formed therein. The contact hole 118a has therein the connection recess 119c of the pixel electrode layer 119. This recess 119c is formed in such a way that part of the pixel electrode layer 119 is recessed toward the substrate 100x. The connection recess 119c permits connection between the pixel electrode layer 119 and the wiring 110 on its bottom surface.

(2) Auxiliary Electrode Layer 200

The substrate 100x has the interlayer insulation layer 118 on the upper surface thereof. The interlayer insulation layer 118 has the auxiliary electrode layer 200, as illustrated in FIGS. 4 and 6. The auxiliary electrode layers 200 are arranged in the row direction between the pixel electrode layers 119, with the intervals δX interposed between them. The interlayer insulation layer 118 has the connection recess 200b along the contact hole 118b of the interlayer insulation layer 118. The connection recess 200b is formed in such a way that part of the auxiliary electrode layer 200 is recessed toward the substrate 100x. The connection recess 200b has inside thereof a contact surface 200c which functions as the inner wall. The connection recess 200b is approximately elliptical as viewed from top. It preferably has a diameter r ranging from 2 to 10 μm. In addition, it preferably has a depth h ranging from 1 to 7 μm. The contact surface 200c is preferably formed in such a way that it has an inclined angle θ ranging from 75° to 120° to the upper surface of the substrate 100x.

(3) Hole Injection Layer 120

The pixel electrode layer 119 has a hole injection layer 120 which is laminated thereon, as illustrated in FIGS. 4 and 5. The hole injection layer 120 transports the holes which have been injected from the pixel electrode layer 119 to a hole transport layer 121.

The hole injection layer 120 includes a lower layer 120A and an upper layer 120B. The lower layer 120A is a layer of metal oxide formed on the pixel electrode layer 119, close to the substrate. The upper layer 120B is a layer of organic substance laminated on the lower layer 120A. A blue sub-pixel, a green sub-pixel, and a red sub-pixel have respectively a lower layer 120AB, a lower layer 120AG, and a lower layer 120AR, which are collectively referred to as the lower layer 120A. Also, a blue sub-pixel, a green sub-pixel, and a red sub-pixel have respectively an upper layer 120BB, an upper layer 120BG, and an upper layer 120BR, which are collectively referred to as the upper layer 120B.

According to the present embodiment, the upper layer 120B linearly extends in the column direction in the gap 522zR, the gap 522zG, and the gap 522zB, which will be described later. By contrast, the upper layer 120B is formed only on the lower layer 120A which is formed on the pixel electrode layer 119. Alternatively, it may be formed intermittently in the column direction in the gap 522z.

(4) Bank 122

The banks of insulator are so formed as to cover the pixel electrode layer 119, the lower layer 120A of the hole injection layer 120, and the edge of the auxiliary electrode layer 200, as illustrated in FIGS. 4 and 5. The banks include the column banks 522Y which extend in the column direction and are arranged parallel to each other in the row direction and also include the row banks 122X which extend in the row direction and are arranged parallel to each other in the column direction. The column banks 522Y cross the row banks 122X at right angles as illustrated in FIG. 3. Thus the column banks 522Y and the row banks 122X constitute a lattice pattern (they will be collectively referred to as "bank 122" unless discrimination is made between the row banks 122X and the column banks 522Y, hereinafter).

The row bank 122X linearly extends in the row direction and has a trapezoidal section tapering upward along the cutting plane parallel to the column direction. The row bank 122X penetrates each of the column banks 522Y so that they cross each other at right angles. The row bank 122X has its upper surface 122Xb positioned below an upper surface 522Yb of the column bank 522Y. Thus, the row banks 122X and the column banks 522Y cross each other to form an opening corresponding to the self-light emitting region 100a.

The row bank 122X is intended to prevent the ink containing an organic compound as a material for the light-emitting layer 123 from flowing in the column direction. Therefore, the row bank 122X preferably has an adequate degree of affinity for the ink. This prevents the amount of ink from fluctuating from one sub-pixel to another. The row bank 122X prevents the pixel electrode layer 119 from exposing itself, and hence the pixel electrode layer 119 dose not emit light and hence does not contribute to luminance in the region where the row bank 122X exists.

To be more specific, the row bank 122X exists above the outer edges 119a1 and 119a2 in the column direction of the pixel electrode layer 119, and it is formed in such a way that it overlaps with the contact region 119b of the pixel electrode layer 119. The non-self-light emitting region 100b where the row bank 122X is formed is restricted in length in the column direction, and the length is larger as much as specified than the interval δY between the outer edges 119a1 and 119a2 in the column direction of the pixel electrode layer 119. As the result, the outer edges 119a1 and 119a2 in the column direction of the pixel electrode layer 119 are covered so as to prevent electrical leakage to the common electrode layer 125 and so as to define the outer edge of the self-light-emitting region 100a of each sub-pixel 100se in the column direction.

The column bank 522Y linearly extends in the column direction and has a trapezoidal section tapering upward along the cutting plane parallel to the row direction. The column bank 522Y defines the outer edge in the row direction of the light-emitting layer 123 which is formed by preventing the ink containing an organic compound as a material for the light-emitting layer 123 from flowing in the row direction.

The column bank 522Y exists above the outer edges 119a3 and 119a4 in the row direction of the pixel electrode layer 119 and also above the outer edges 200a1 and 200a2 in the row direction of the auxiliary electrode layer 200, and it is formed in such a way that it overlaps partly with the pixel electrode layer 119 and the auxiliary electrode layer 200. The column bank 522Y is formed in the region which is wider in the row direction than the distance (δX) between the row direction outer edges 119a3 and 119a4 of the pixel electrode layer 119 by a predetermined width. The result is that the row direction outer edges 119a3 and 119a4 of the pixel electrode layer 119 are covered. This effectively prevents electrical leakage to the common electrode layer 125 and also defines the outer edge of the self-light-emitting region 100a of the respective sub-pixels 100se in the row direction. The column bank 522Y defines the outer edge of the self-light emitting region of each pixel in the column direction, as mentioned above. Therefore, it preferably has an ability to repel ink to a certain extent.

(5) Hole Transport Layer 121

The row bank 122X and the hole injection layer 120 in each of the gaps 522zR, 522zG, and 522zB are coated with the hole transport layer 121, as illustrated in FIGS. 4 and 5. The hole transport layer 121 is in contact with the upper layer 120B of the hole injection layer 120. The hole transport layer 121 transports the holes injected from the hole injection layer 120 to the light-emitting layer 123. Each hole transport layer 121 formed in the gaps 522zR, 522zG, and 522zB is referred to as a hole transport layer 121R, a hole transport layer 121G, and a hole transport layer 121B, respectively.

According to the present embodiment, the hole transport layer 121 in the gap 522z to be mentioned later linearly extends in the column direction as in the case of the upper layer 120B. However, the hole transport layer 121 may extend intermittently in the column direction in the gap 522z.

(6) Light-Emitting Layer 123

The hole transport layer 121 is coated with the light-emitting layer 123, as illustrated in FIGS. 4 and 5. The light-emitting layer 123 is a layer of organic compound; it emits light as the result of recombination of holes and electrons therein. The light-emitting layer 123 in each of the gap 522zR, the gap 522zG, and the gap 522zB linearly extends in the column direction. The light-emitting layer 123 extends in the column direction in the gap 522zR, the gap 522zG, and the gap 522zB which are defined by the column bank 522Y. Light-emitting layers 123R, 123G, and 123B, which emit R, G, B colors respectively, are formed respectively in the red gap 522zR corresponding to the self-light emitting region 100aR in the red sub-pixel 100seR, the green gap 522zG corresponding to the self-light emitting region 100aG in the green sub-pixel 100seG, and the blue gap 522zB corresponding to the self-light emitting region 100aB in the blue sub-pixel 100seB.

The light-emitting layer 123 emits light from only that part which is supplied with carriers from the pixel electrode layer 119. Therefore, the electroluminescence of the organic compound does not occur in the region where the row bank 122X as an insulator exists between the layers. Therefore, the light-emitting layer 123 emits light from only that part where the row bank 122X does not exist. This part functions as the self-light emitting region 100a and its outer edge in the column direction of the self-light emitting region 100a is defined by the outer edge in the column direction of the row bank 122X.

The light-emitting layer 123 has the part, which does not emit light, above the side and the upper surface 122Xb of the row bank 122X. This part is the non-self-light emitting region 100b. The self-light emitting region 100a of the light-emitting layer 123 is on the upper surface of the hole transport layer 121, and the non-self-light emitting region 100b of the light-emitting layer 123 is on the upper surface of the row bank 122X and the upper surface of the hole transport layer 121 on the side of the row bank 122X.

Incidentally, the light-emitting layer 123 continuously extends not only in the self-light emitting region 100a but also to the non-self-light emitting region 100b adjoining thereto. The effect of this structure is that the ink which is applied to the self-light emitting region 100a at the time of forming the light-emitting layer 123 flows in the column direction through the ink which has been applied to the non-self-light emitting region 100b, thereby producing a uniform film thickness from one pixel to another in the column direction. However, the ink flow is adequately controlled by the row bank 122X in the non-self-light emitting region 100b. This helps achieve a uniform film thickness in the column direction, thereby ensuring uniform luminance for every pixel.

(7) Electron Transport Layer 124

The gap 522z defined by the column bank 522Y and the column bank 522Y is covered with an electron transport layer 124, as illustrated in FIGS. 4, 5 and 6. The electron transport layer 124 is formed continuously all over the display panel 10.

The electron transport layer 124 is formed on the light-emitting layer 123, as illustrated in FIGS. 4 and 5. The electron transport layer 124 transports electrons from the common electrode layer 125 to the light-emitting layer 123 and also controls injection of electrons into the light-emitting layer 123.

The electron transport layer 124 is formed also on the auxiliary electrode layer 200, as illustrated in FIGS. 4 and 6. The electron transport layer 124 a nick (between the edges 124a1 and 124a2 and between the edges 124a3 and 124a4 in the figures) in the connection recess 200b of the auxiliary electrode layer 200, and hence it causes the contact surface 200c of the auxiliary electrode layer 200 to expose itself at the nick.

(8) Common Electrode Layer 125

The electron transport layer 124 is coated with the common electrode layer 125, as illustrated in FIGS. 4, 5 and 6. The common electrode layer 125 is formed all over the display panel 10, and it functions as the electrode common to the light-emitting layers 123.

The common electrode layer 125 is formed also in the region above the pixel electrode layer 119 on the electron transport layer 124, as illustrated in FIGS. 4 and 5. The common electrode layer 125 is paired with the pixel electrode layer 119 so that they hold the light-emitting layer 123 between them, thereby forming an electric path through which the light-emitting layer 123 is supplied with carriers. For example, if it functions as an anode, the light-emitting layer 123 is supplied with electrons.

The common electrode layer 125 is formed also in the region above the auxiliary electrode layer 200 on the electron transport layer 124, as illustrated in FIGS. 4 and 6. The common electrode layer 125 is so formed as to come into direct contact with the contact surface 200c which exposes itself at the nick (between the edges 124a1 and 124a2 or between the edges 124a3 and 124a4) of the electron transport layer 124.

(9) Sealing Layer 126

The common electrode layer 125 is covered with a sealing layer 126 formed thereon. The sealing layer 126 is intended to protect the light-emitting layer 123 from deterioration due to contact with moisture and air. The sealing layer 126 is formed all over the display penal 10 so that it covers the upper surface of the common electrode layer 125.

(10) Bonding Layer 127

The sealing layer 126 is coated with a bonding layer 127. The bonding layer 127 joins together the sealing layer 126 and a color filter substrate 131 thereon which is composed of an upper substrate 130 and a color filter layer 128 formed on a main surface of the upper substrate 130 on the lower side in the Z-direction. The bonding layer 127 joins a back panel (which includes various layers from the substrate 100x to the sealing layer 126) to the color filter substrate 131. It also protects such layers from contact with moisture and air.

(11) Upper Substrate 130

The bonding layer 127 is covered with and joined to the color filter substrate 131 which includes the upper substrate 130 and the color filter layer 128. The upper substrate 130 is made of a light-transmitting material, such as cover glass and transparent resin film, so that the display panel 10 functions as that of top emission type. The upper substrate 130 makes the display panel 10 rigid and also protects the display panel 10 from moisture and air.

(12) Color Filter Layer 128

The upper substrate 130 has the color filter layer 128 formed thereunder at the position corresponding to the self-light emitting region 100a of each pixel. The color filter layer 128 is a transparent layer that transmits visible light of wavelength corresponding to R, G, and B. It transmits the light emitted from each pixel and corrects its chromaticity. According to this embodiment, red, green, and blue filter layers 128R, 128G, and 128B are formed respectively on the self-light emitting region 100aR in the red gap 522zR, the self-light emitting region 100aG in the green gap 522zG, and the self-light emitting region 100aB in the blue gap 522zB.

(13) Shading Layer 129

The upper substrate 130 has a shading layer 129 formed thereunder at the position corresponding to the boundary between the light-emitting regions 100a of each pixel. The shading layer 129 is a black resin layer which blocks visible light of wavelength corresponding to R, G, and B. It is made of a resinous material filled with a black pigment superior in light absorption and light shading performance.

1.4.3 Material Constituting Each Part

The following is a description of the material constituting each part illustrated in FIGS. 4, 5 and 6.

(1) Substrate 100x (TFT Substrate)

The substrate may be selected from a glass substrate, a quartz substrate, a silicon substrate, a metal substrate of molybdenum sulfide, copper, zinc, aluminum, stainless steel, magnesium, iron, nickel, gold, or silver, a semiconductor substrate such as a gallium arsenide substrate, and a plastic substrate. It may also be formed from a flexible plastic material, such as thermoplastic resin and thermosetting resin. A variety of materials including resin materials may be used which have electrical insulating properties. Any known materials may be used to form the TFT which includes the gate electrode, the gate insulation layer, the channel layer, the channel protecting layer, the source electrode, and the drain electrode. For example, the gate electrode is a laminate composed of copper (Cu) and molybdenum (Mo), and the gate insulation layer is made of any electrically insulating material such as silicon oxide (SiO2) and silicon nitride (SiNx). They are known organic and inorganic materials. The channel layer may be formed from an oxide semiconductor containing at least one selected from indium (In), gallium (Ga), and zinc (Zn). The channel protecting layer may be formed from, for example, silicon oxide nitride (SiON), silicon nitride (SiNx), or aluminum oxide (AlOx). The source electrode and the drain electrode in laminate form may be formed from, for example, copper manganese (CuMn), copper (Cu), and molybdenum (Mo).

The insulation layer on the TFT may be formed from, for example, silicon oxide (SiO2), silicon nitride (SiN), and silicon oxide nitride (SiON). The connecting electrode layer of the TFT may be a laminate formed from, for example, molybdenum (Mo), copper (Cu), and copper manganese (CuMn). The materials for the connecting electrode layer are not limited to those mentioned above; they may be selected from any conductive materials.

The substrate 100x is covered with the interlayer insulation layer 118, which is made of an organic compound such as polyimide resin, acrylic resin, siloxane resin, and phenolic resin of novolak type.

(2) Pixel Electrode Layer 119 and Auxiliary Electrode Layer 200

The pixel electrode layer 119 is made of a metallic material. The display panel 10 of top emission type pertaining to the present embodiment may require that the pixel electrode layer 119 has a highly reflective surface because it is so designed as to adjust the chromaticity and increase the luminance of the emitted light by the light oscillating structure with an optimal layer thickness. According to the present embodiment, the display panel 10 may have the pixel electrode layer 119 in the form of laminate composed of a plurality of layers selected from a metal layer, an alloy layer, and a transparent conductive layer. The metal layer may be formed from any metallic material including silver (Ag) or aluminum (Al). The alloy layer may be formed from, for example, APC (alloy of silver, palladium, and copper), ARA (alloy of silver, rubidium, gold), MoCr (alloy of molybdenum and chromium), and NiCr (alloy of nickel and chromium). The transparent conductive layer may be formed from, for example, indium tin oxide (ITO) or indium zinc oxide (IZO).

The auxiliary electrode layer 200 may be formed from the same material as used for the pixel electrode layer 119.

(3) Hole Injection Layer 120

The hole injection layer 120 is composed of the lower layer 120A and the upper layer 120B. The lower layer 120A is formed from an oxide of such a metal as silver (Ag), molybdenum (Mo), chromium (Cr), vanadium (V), tungsten (W), nickel (Ni), and iridium (Ir). The lower layer 120A formed from an oxide of transition metal assumes more than one level because the oxide of transition metal has more than one oxidation number. This facilitates hole injection and lowers the drive voltage. According to the present embodiment, the lower layer 120A is made of an oxide of tungsten (W). The tungsten oxide used for this purpose preferably contains more pentavalent tungsten than hexavalent tungsten, with the ratio W5+/W6+ being high, so that the organic EL element works at a lower drive voltage.

The upper layer 120B of the hole injection layer 120 may be a film formed by coating with a solution of organic polymer (conductive polymer) such as PEDOT (mixture of polythiophene and polystyrenesulfonic acid).

(4) Bank 122

The bank 122 is formed from an organic material such as resin and it is capable of electrical insulation. The organic material for the bank 122 includes, for example, acrylic resin, polyimide resin, and phenolic resin of novolak type. The bank 122 is preferably resistant to an organic solvent. An acrylic resin is preferable because of its low refractive index, which makes it suitable for use as the reflector.

The bank 122 may also be formed from an inorganic material from the standpoint of refractive index. Preferable examples of the inorganic material include silicon oxide (SiO), silicon nitride (SiN), and silicon oxynitride (SiON).

The material for the bank 122 is preferably highly resistant to excessive deformation and deterioration that might occur during etching and baking in the manufacturing process.

The bank 122 may have its surface fluorine-treated so as to impart water repellency. This object may be achieved by forming the bank 122 from a fluorine-containing material.

Also, the bank 122 may have its surface undergone ultraviolet (UV) irradiation or low-temperature baking to reduce its surface water repellency.

(5) Hole Transport Layer 121

The hole transport layer 121 may be formed from a polymeric compound, such as polyfluorene and derivative thereof, polyarylamine as amine-based organic polymer and derivative thereof, and TFB (poly(9,9-di-n-octylfluorene-alt-(1,4-phenylene-((4-sec-butylphenyl)imino)-1,4-phenylene)).

(6) Light-Emitting Layer 123

The light-emitting layer 123 emits light by becoming excited as the result of injection and recombination of holes and electrons. The light-emitting layer 123 is required to be formed from any luminescent organic material suitable for wet-printing process to make film.

The organic material is any one of the fluorescent substances exemplified below;

Oxinoid compounds (disclosed in Japanese Patent Laid-open No. 1993-163488), perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyrane compounds, dicyanomethylenethiopyrane compounds, fluorescein compounds, pyrylium compounds, thiapyrylium compounds, selenapyrylium compounds, telluropyrylium compounds, aromatic aldadiene compounds, oligo phenylene compounds, thioxanthene compounds, anthracene compounds, cyanine compounds, acridine compounds, metal complex of 8-hydroxyquinoline compounds, metal complex of 2-bipyridine compounds, complex of Schiff base and III-group metal, oxine metal complex, and rare earth complex.

(7) Electron Transport Layer 124

The electron transport layer 124 is formed from an organic material highly capable of electron transportation. The organic material for the electron transport layer 124 includes, for example, oxadiazole derivatives (OXD), triazole derivatives (TAZ), and phenanthroline derivatives (BCP, Bphen), which are low molecular organic materials having $\pi$ electrons. The electron transport layer 124 may have an additional layer formed from an organic material (with high electron transport capability) doped with a metal selected from alkali metals or alkaline earth metals. The electron transport layer 124 may also have an additional layer formed from sodium fluoride. Examples of the alkali metal include Li (lithium), Na (sodium), K (potassium), Rb (rubidium), Cs (cesium), and Fr (francium). Examples of the alkaline earth metal include Ca (calcium), Sr (strontium), Ba (barium), and Ra (radium).

(8) Common Electrode Layer 125

The common electrode layer 125 is formed from an electrically conductive material capable of light transmission, which includes, for example, indium tin oxide (ITO) or indium zinc oxide (IZO). It may be a thin film formed from silver (Ag) or aluminum (Al).

(9) Sealing Layer 126

The sealing layer 126 protects the organic layer such as the light-emitting layer 123 from moisture and air. It is formed from a light-transmitting material such as silicon nitride (SiN) or silicon oxynitride (SiON). The layer formed from a material such as silicon nitride (SiN) or silicon oxynitride (SiON) may be coated with an additional sealing resin layer of acrylic resin or silicone resin.

It is required that the sealing layer 126 is formed from a light-transmitting material in the display panel 10 according to the present embodiment which is of top emission type.

(10) Bonding Layer 127

The bonding layer 127 is formed from an adhesive of light-transmitting resin material, such as acrylic resin, silicone resin, and epoxy resin.

(11) Upper Substrate 130

The upper substrate 130 may be a glass substrate, a quartz substrate, or a plastic substrate, which is transparent to light.

(12) Color Filter Layer 128

The color filter layer 128 is formed from any known plastics material (for example, as a commercial product, "Color Resist" made by JSR Inc.).

(13) Shading Layer 129

The shading layer 129 is formed from a resin material composed of a UV-curable resin (e.g., UV-curable acrylic resin) as a main component and a black pigment added thereto. The black pigment may be selected from carbon black pigment, titanium black pigment, metal oxide pigment, and organic pigment, which are capable of blocking light.

1.5 Method for Producing Display Panel 10

The display panel 10 is produced by the method described below with reference to FIGS. 7A, 7B, 7C, 7D, 8A, 8B, 8C, 9A, 9B, 9C, 9D, 10A, 10B, 10C, 10D, 10E, 10F, 10G, 11A and 11B.

(1) Preparation of Substrate 100x

The first step is to prepare the substrate 100x which has TFTs and their wiring 110 formed thereon. The substrate 100x can be produced by any known TFT production method (see FIG. 7A).

(2) Formation of Interlayer Insulation Layer 118

The substrate 100x is coated with the photosensitive resin material (as a constituent of the interlayer insulation layer 118), which functions as a photoresist. With its surface planarized, the coating film becomes the interlayer insulation layer 118 (see FIG. 7B).

Figure 7A:
FIGS. 7A, 7B, 7C and 7D are schematic sectional views taken along the line A1-A1 in FIG. 3, they illustrate individual steps in the production of the organic EL display panel.
Figure 7B:
Figure 7C:
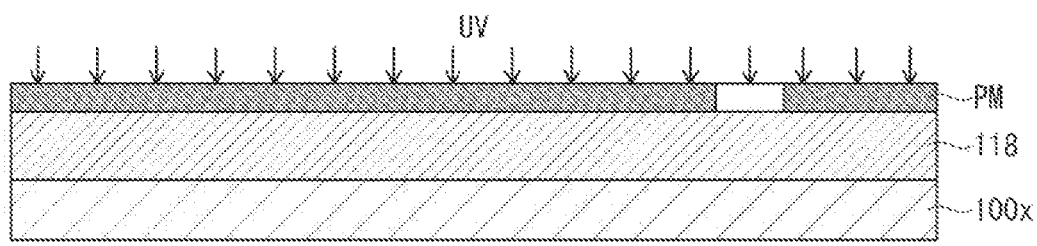

The interlayer insulation layer 118 is covered with a photomask having predetermined openings and then irradiated with ultraviolet rays through the photomask so that the mask pattern is transferred (see FIG. 7C).

Figure 7D:
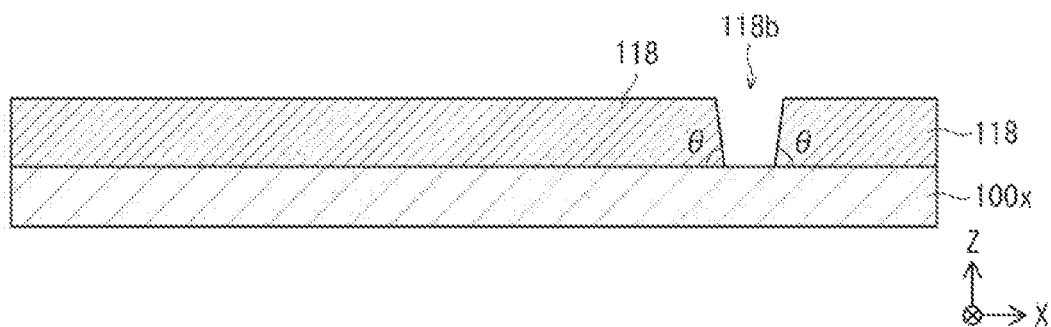

After development, there is obtained the interlayer insulation layer 118 which has the pattern for the contact hole 118a and the contact hole 118b (see FIG. 7D). The contact hole 118a is formed such that its bottom allows the wiring 110 to expose itself, and the contact hole 118b is formed such that its bottom allows the substrate 100x to expose itself.

According to the present embodiment, the interlayer insulation layer 118 is formed by using a photoresist of positive type. However, it is also possible to form the interlayer insulation layer 118 by using a photoresist of negative type.

(3) Formation of Pixel Electrode Layer 119 and Auxiliary Electrode Layer 200

Figure 8A:
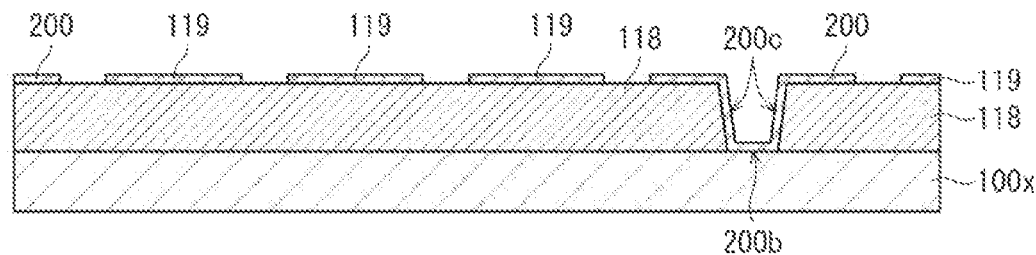
FIGS. 8A, 8B and 8C are schematic sectional views taken along the line A1-A1 in FIG. 3, they illustrate individual steps in the production of the organic EL display panel.

The step of forming the interlayer insulation layer 118 which has the contact holes 118a and 118b formed therein is followed by the step of forming the pixel electrode layer 119 and the auxiliary electrode layer 200 (see FIG. 8A).

The step of forming the pixel electrode layer 119 and the auxiliary electrode layer 200 is performed by sputtering to form a metal film and thereafter patterning it by photolithography and etching. The metal film is formed on the inner wall of the contact hole 118a. In this way, there is formed the connection recess 119c of the pixel electrode layer 119. In the same way as above, the contact hole 118b has its inner wall coated with a metal film, so that there is formed the connection recess 200b of the auxiliary electrode layer 200 having the contact surface 200c along the inner surface of the contact hole 118b.

The pixel electrode layer 119 comes into direct contact with the wiring 110 which exposes itself at the bottom of the contact hole 118a, so that it is electrically connected to the electrode of the TFT.

(4) Formation of Lower Layer 120A of Hole Injection Layer 120

Figure 8B:
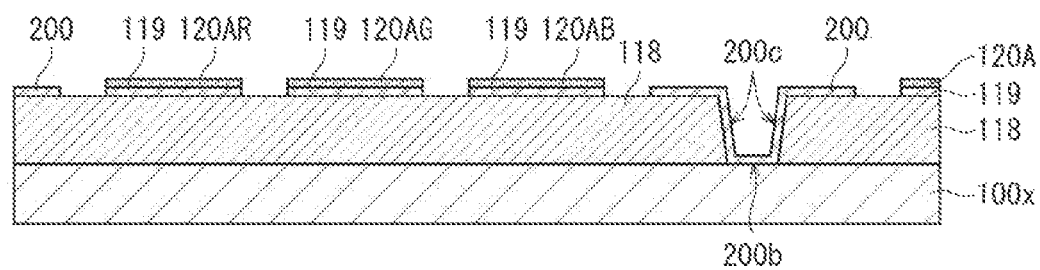

The step of forming the pixel electrode layer 119 and the auxiliary electrode layer 200 is followed by the step of forming the lower layer 120A of the hole injection layer 120 on the pixel electrode layer 119 (see FIG. 8B).

The step of forming the lower layer 120A is performed by forming a film of metal (such as tungsten), oxidizing the metal film by baking, and patterning (into pixel units) by photolithography and etching. The metal film is formed by the vapor phase growth method such as sputtering and vacuum deposition.

(5) Formation of Bank 122

Figure 8C:
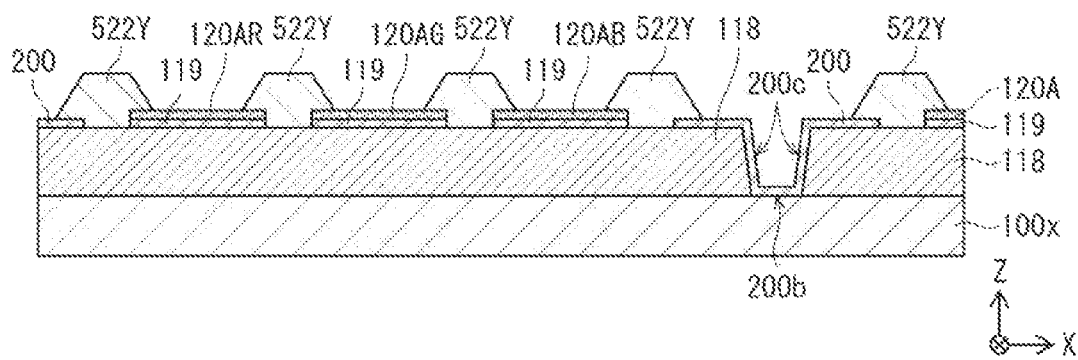

The step of forming the lower layer 120A of the hole injection layer 120 is followed by forming the bank 122 in such a way that it covers the edges of the lower layer 120A and the auxiliary electrode layer 200 (see FIG. 8C).

The bank 122 is formed in two steps. First, the row bank 122X is formed, and then the column bank 522Y is formed so that the gap 522z is formed. The bank 122 is formed in such a way that the surface of the auxiliary electrode layer 200 exposes itself in the gap 522z. The bank 122 is also formed in such a way that the lower layer 120A of the hole injection layer 120 and the surface of the auxiliary electrode layer 200 expose themselves in the area between the row bank 122X and the row bank 122X within the gap 522z.

The bank 122 is formed by covering the lower layer 120A of the hole injection layer 120 with a resin film of, for example, photosensitive resin material (which is a constituent of the bank 122) by spin coating. Then, the resin film undergoes patterning, so that the row bank 122X and the column bank 522Y are sequentially formed. The patterning of the row bank 122X and the column bank 522X is accomplished by exposure through a photomask placed on the resin film, development, and baking (at approximately 230° C. for approximately 60 minutes).

To be more specific, the step of forming the bank 122X starts with forming a film of photosensitive resin, such as organic photosensitive resin material, for example, acrylic resin, polyimide resin, and phenolic resin of novolac type. The resulting film is dried by solvent evaporation to an adequate extent. The dried film is exposed to ultraviolet rays through a photomask (having predetermined openings) placed thereon, so that the mask pattern is transferred to the photoresist. Then, the photosensitive resin is developed, so that the insulation layer having the pattern of the bank 122X is formed. The photosensitive resin is usually a photoresist of positive type, which has the exposed part removed by development, with the unexposed part under the mask pattern remaining undeveloped.

The step of forming the column bank 522Y starts with forming a film from, for example, a photosensitive resin material (which is a constituent of the column bank 522Y) by spin coating. Then, the resulting resin film undergoes patterning, so that the gap 522z is formed. The step of forming the gap 522z includes placement of a mask on the resin film, exposure through the mask, and development. The column bank 522Y extends in the column direction and adjoins to another one, with the gap 522z interposed between them in the row direction.

(6) Formation of Organic Functional Layer

The row bank 122X and the column bank 522Y define the gap 522z, which has the hole injection layer 120 therein. The injection layer 120 has its lower layer 120A coated sequentially with the upper layer 120B of the hole injection layer 120, the hole transport layer 121, and the light-emitting layer 123 (see FIG. 9A).

The upper layer 120B is formed by ink jet printing method with an ink containing a conductive polymer such as PEDOT (a mixture of polythiophene and polystyrenesulfonic acid). This ink is applied to the inside of the gap 522z which is defined by the column bank 522Y, and the applied ink is freed of solvent by evaporation or the applied ink undergoes baking. This step is followed by patterning for division into pixel units which is achieved by photolithography and etching.

The hole transport layer 121 is formed by wet process such as ink jet printing or gravure printing. This step is accomplished by coating the inside of the gap 522z (which is defined by the column banks 522Y) with the ink containing the constituent. The applied ink is freed of solvent by evaporation or the applied ink undergoes baking. The ink for the hole transport layer 121 is applied to the inside of the gap 522z in the same way as that used for the upper layer 120B as mentioned above. There is an alternative method which includes depositing films of metal (such as tungsten) by sputtering and ensuing baking for oxidation. This step completes with photolithography and etching for division into pixel units by patterning.

The light-emitting layer 123 is formed by ink jet printing, which includes coating the gap 522z (defined by the column bank 522Y) with an ink containing the material that constitutes the light-emitting layer 123, followed by baking. To be more specific, this step is accomplished in the following way. First, the gap 522z to become the sub-pixel forming region is filled by ink jet printing with any one of the inks 123RI, 123GI, 123BI which contains the material for the organic light-emitting layer for R, G, or B. The ink filling the gap is dried under reduced pressure, followed by baking, so as to form the light-emitting layer 123R, 123G, and 123B. The step of ink application to the light-emitting layer 123 is achieved in the following way. First, the light-emitting layer 123 is formed by coating with a solution with the help of a liquid drop discharging apparatus. In this way, the substrate 100x is coated with an ink that forms the red light-emitting layer. This ink coating step is repeated to sequentially form the green light-emitting layer and the blue light-emitting layer. The sequential steps of coating with inks for three colors form the red light-emitting layer, the green light-emitting layer, and the blue light-emitting layer, which are arranged repeatedly in the lateral direction on the paper surface in the drawing. The step of coating the inside of the gap 522z with an ink for the light-emitting layer 123 may be accomplished in the same way as mentioned above which is employed for the upper layer 120B.

The foregoing is concerned with the method for forming the upper layer 120B of the hole injection layer 120, the hole transport layer 121, and the light-emitting layer 123, by ink jet printing or gravure printing. These methods may be replaced by any other known ones such as dispenser method, nozzle coating, spin coating, intaglio printing, and letter press printing.

(7) Formation of Electron Transport Layer 124

Figure 9A:
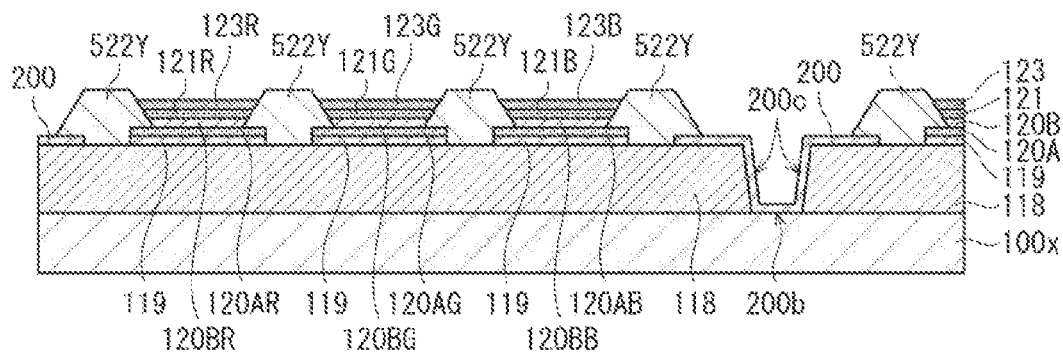
FIGS. 9A, 9B, 9C and 9D are schematic sectional views taken along the line A1-A1 in FIG. 3, they illustrate individual steps in the production of the organic EL display panel.
Figure 9B:
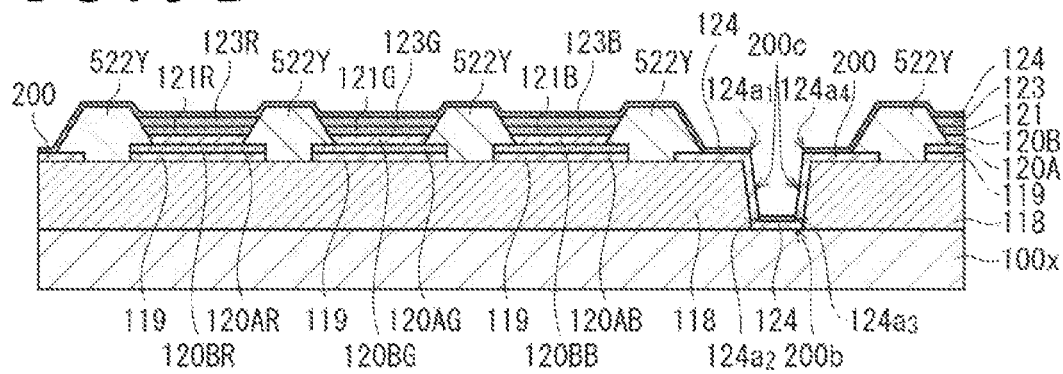

The step of forming the light-emitting layer 123 is followed by the step of forming (by vacuum deposition or the like) the electron transport layer 124 all over the display panel 10 (see FIG. 9B). The electron transport layer 124 is also formed on the auxiliary electrode layer 200. This step is accomplished in the following way. First, the auxiliary electrode layer 200 is made in such a way that the contact surface 200c of the connection recess 200b has an intentional nick (broken step). Then the auxiliary electrode layer 200 is formed such that the contact surface 200c of the connection recess 200b exposes itself in the nick (between the edges 124a1 and 124a2 and between the edges 124a3 and 124a4).

(8) Formation of Common Electrode Layer 125

Figure 9C:
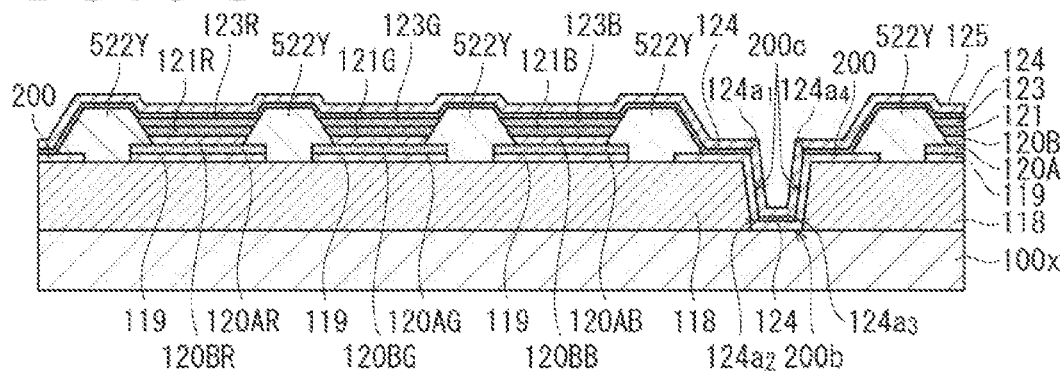

The electron transport layer 124 formed in the previous step is covered with the common electrode layer 125 to be formed by a CVD method or a sputtering method (see FIG. 9C). The common electrode layer 125 is also formed in the region above the auxiliary electrode layer 200 on the electron transport layer 124. This step is carried out in such a way that the common electrode layer 125 surrounds the nick (between the edges 124a1 and 124a2 and between the edges of 124a3 and 124a4) of the electron transport layer 124 and comes into direct contact with the contact surface 200c of the connection recess 200b of the auxiliary electrode layer 200 which exposes itself at the nick of the electron transport layer 124.

The following is a detailed description of the method for forming the common electrode layer 125.

Figure 12:
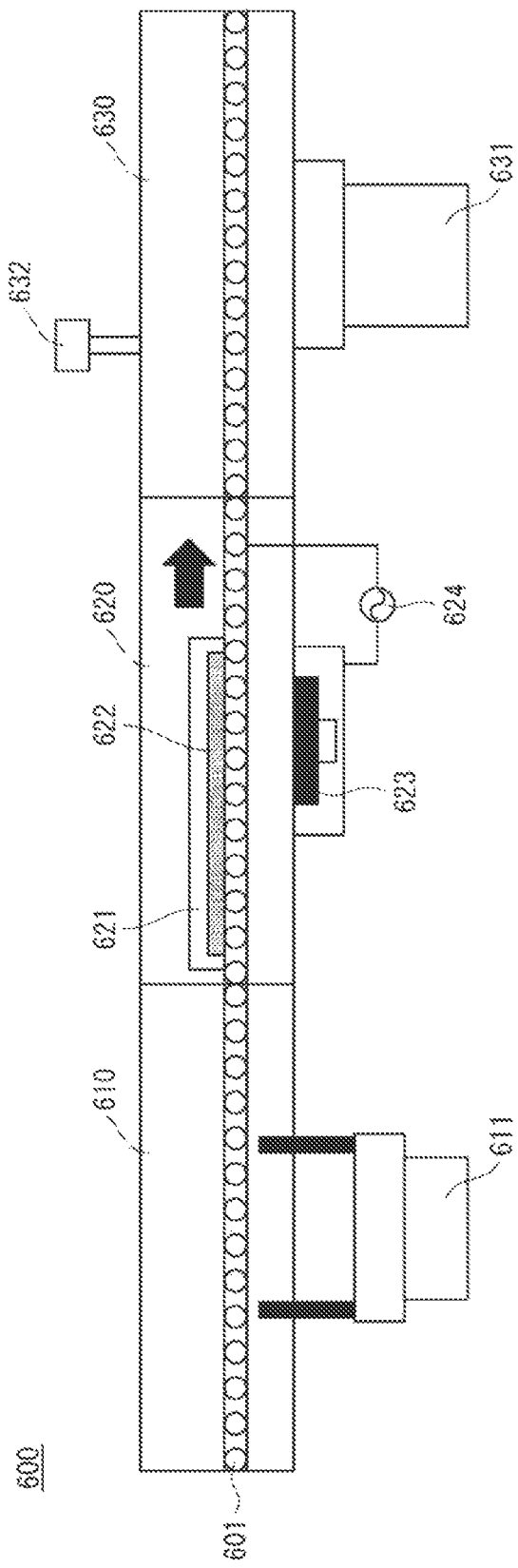
FIG. 12 is a schematic diagram illustrating a sputtering apparatus used for production of a common electrode layer.

The method in question employs a sputtering apparatus 600 as schematically illustrated in FIG. 12. The sputtering apparatus 600 includes a substrate delivering chamber 610, a film forming chamber 620, and a load locking chamber 630. It is in the film forming chamber 620 that sputtering is performed by the magnetron sputtering method. The film forming chamber 620 is filled with a sputtering gas, which is an inert gas such as Ar (argon). Ar is employed in the present embodiment.

The sputtering apparatus 600 holds therein a carrier 621 in which a substrate 622 being processed is placed. The substrate 622 is mounted on the carrier 621 by a substrate pushing mechanism 611 in the substrate delivering chamber 610. The carrier 621 holding the substrate 622 proceeds from the substrate delivering chamber 610 to the load locking chamber 630 through the film forming chamber 620 along a straight transport path 601 at a constant rate. According to present embodiment, the carrier 621 moves at a rate of 30 mm/second. The substrate 622 undergoes sputtering at room temperature without heating.

The film forming chamber 620 is provided with a rodlike target 623 which extends in the direction perpendicular to the transport path 601. The target 623 used in the present embodiment is ITO. Incidentally, the target 623 may be in the form of powder instead of rod.

A power source 624 applies a voltage to the target 623. The power source 624 illustrated in FIG. 12 is an alternating current (AC) source; it may also be a direct current (DC) source or a DC/AC hybrid source.

The sputtering apparatus 600 is evacuated by an evacuating system 631 and the film forming chamber 620 is charged with a sputtering gas from a gas supply system 632. Voltage application to the target 623 from the power source 624 causes the sputtering gas to generate a plasma which performs sputtering on the surface of the target 623. The sputtered target 623 emits its constituent atoms which deposit on the substrate 622. Thus, the film forming process completes.

Incidentally, the sputtering gas or Ar gas is supplied at a pressure of, for example 0.6 Pa and at a flow rate of 100 sccm.

(9) Formation of Sealing Layer 126

Figure 9D:
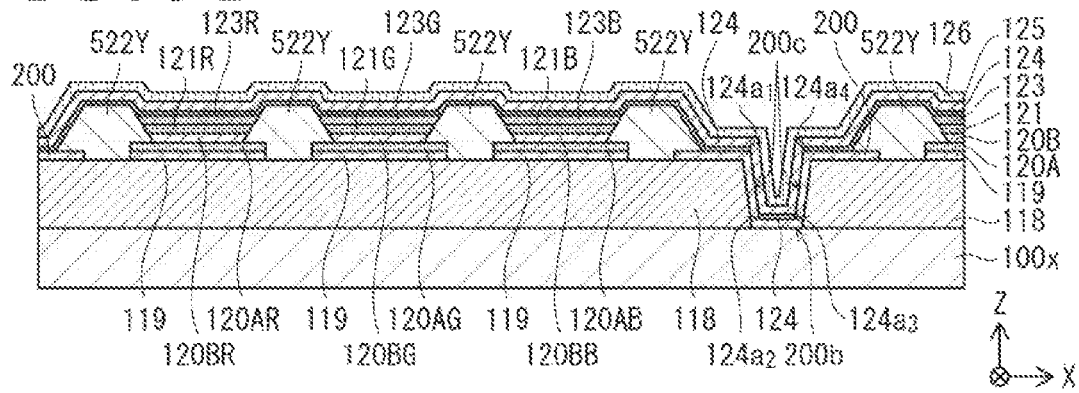

The common electrode layer 125 formed in the preceding step is covered with the sealing layer 126 which is formed by a CVD method or a sputtering method (see FIG. 9D).

(10) Formation of Color Filter Substrate 131

The following illustrates the process of producing the color filter substrate 131.

Figure 10A:
FIGS. 10A, 10B, 10C, 10D, 10E, 10F and 10G are schematic sectional views taken along the line A1-A1 in FIG. 3, they illustrate individual steps in the production of the organic EL display panel.
Figure 10B:
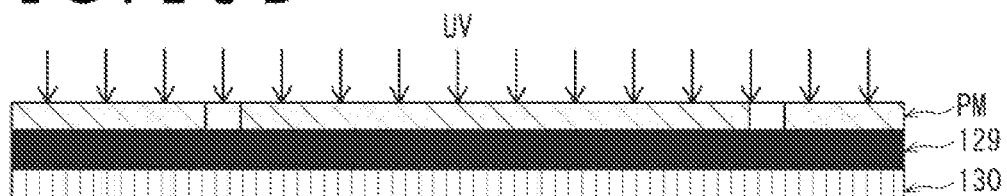
Figure 10C:
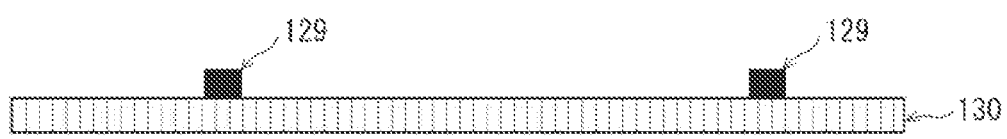

The transparent upper substrate 130 which has been prepared separately is covered at one side thereof with the shading layer 129 composed of a UV-curable resin (e.g., UV-curable acrylic resin) as a main component and a black pigment added thereto (see FIG. 10A).

The thus formed shading layer 129 has its upper surface covered with the patterning mask (PM) having predetermined openings. The shading layer 129 is irradiated with UV light through the patterning mask (see FIG. 10B).

This step is followed by development and curing, with the patterning mask (PM) and the uncured shading layer 129 removed. Thus there is obtained the shading layer 129 having a square cross section (see FIG. 10C).

Figure 10D:
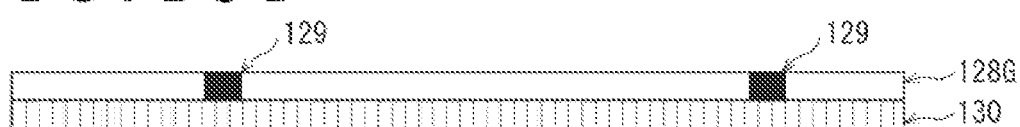

The upper substrate 130 with the shading layer 129 formed thereon has its surface coated with a material 128G to be made into the color filter layer 128 (G, for instance) which is composed mainly of the UV-curable resin (see FIG. 10D). With a predetermined patterning mask (PM) placed thereon, the color filter layer 128 undergoes UV light irradiation (see FIG. 10E).

Figure 10E:
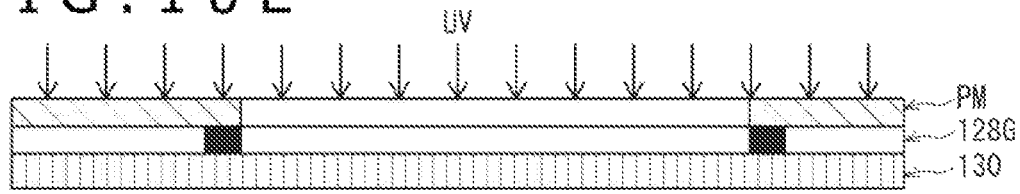
Figure 10F:

The subsequent steps of curing and development with the patterning mask PM and uncured paste 128R removed give rise to a color filter layer 128(G) (see FIG. 10F).

Figure 10G:
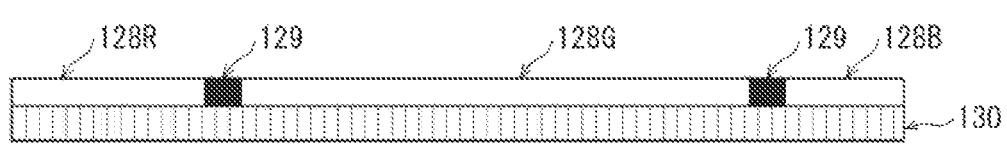
Figure 11A:
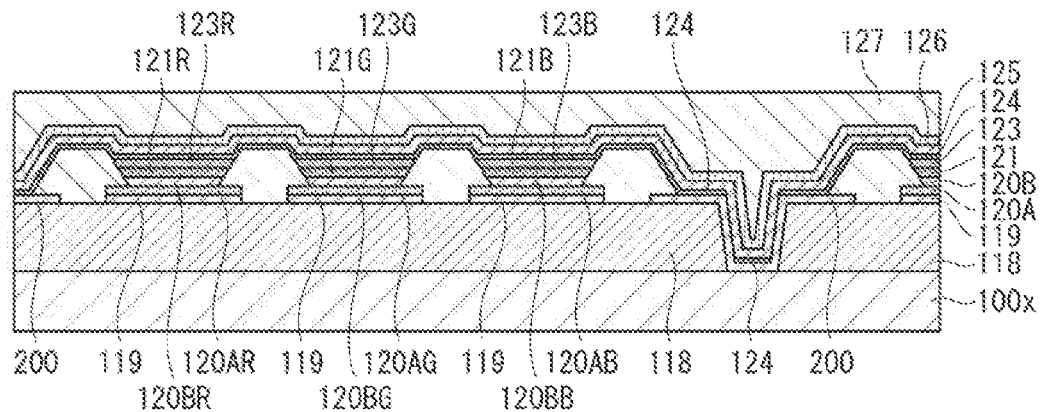
FIGS. 11A and 11B are schematic sectional views taken along the line A1-A1 in FIG. 3, they illustrate individual steps in the production of the organic EL display panel.
Figure 11B:
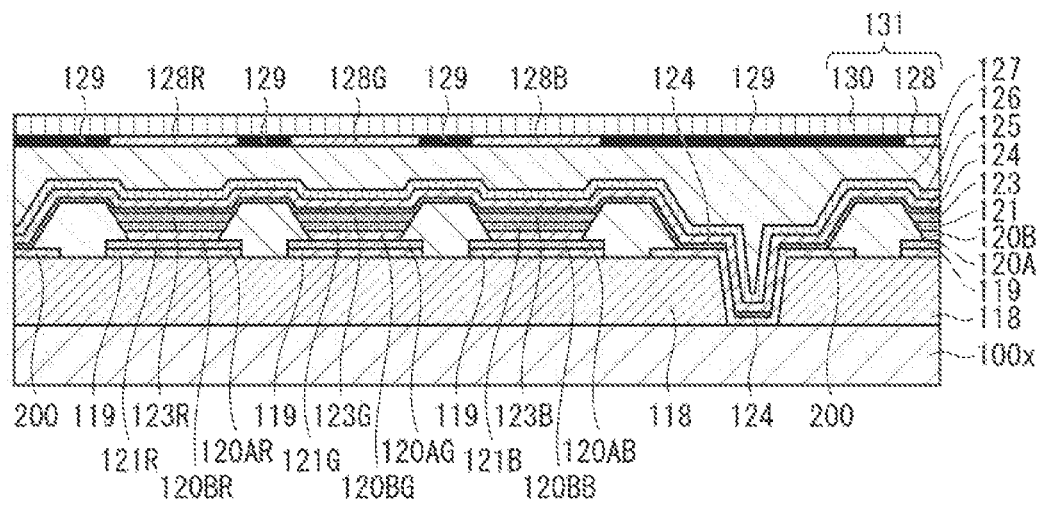

The steps illustrated in FIGS. 10D, 10E, and 10F are similarly repeated for individual color filter materials so as to form color filter layers 128(R) and 128(B) (see FIG. 10G). Incidentally, the paste 128R may be substituted with any commercial color filter product.

The foregoing steps complete the color filter substrate 131.

(11) Lamination of Color Filter Substrate 131 and Back Panel with Each Other

In this step, the back panel including several layers from the substrate 100x to the sealing layer 126 is coated with a material for the bonding layer 127. This material is composed mainly of UV-curable resin such as acrylic resin, silicone resin, and epoxy resin (see FIG. 11A).

The coating formed in the previous step undergoes UV irradiation, so that the two substrates are bonded together, with the back panel and the color filter substrate 131 properly positioned. This step may require observation to prevent gas from entering the space between them. Finally, the two substrates undergo baking to complete the sealing step. In this way, the display panel 10 is completed (see FIG. 11B).

1.6 Structure for Direct Contact Between Auxiliary Electrode Layer 200 and Common Electrode Layer 125

Figure 13:
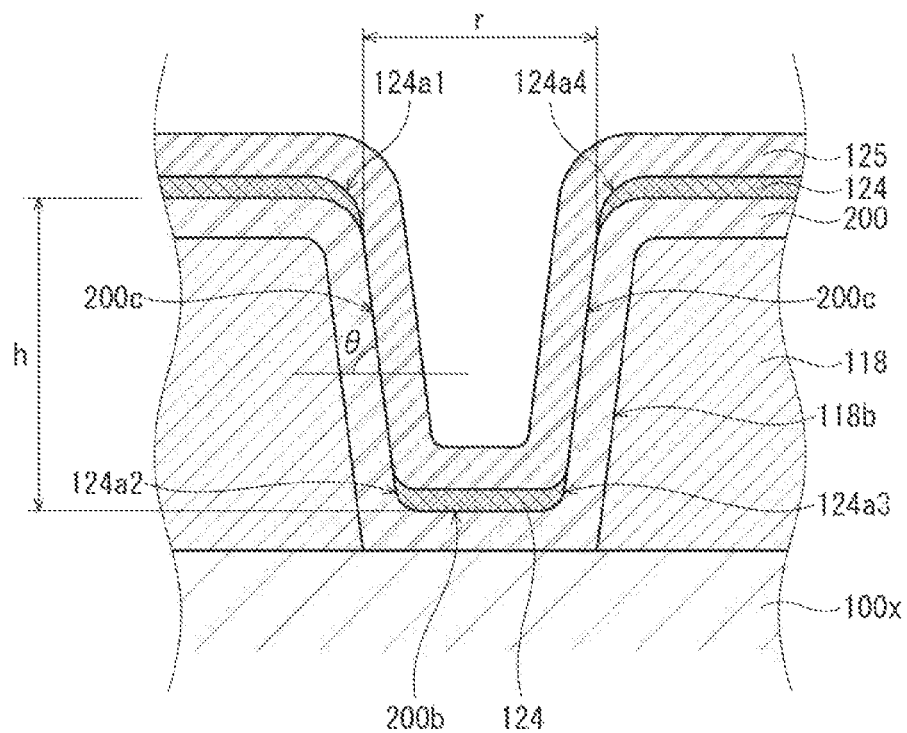
FIG. 13 is an enlarged view illustrating the periphery of an auxiliary electrode layer illustrated in FIG. 4.

FIG. 13 is an enlarged view of the auxiliary electrode layer 200 and its periphery illustrated in FIG. 4. The auxiliary electrode layer 200 is preferably formed in such a way that the oblique angle θ with respect to the contact surface is from 75° to 120°. With an angle smaller than 75°, the electron transport layer 124 does not break at the step, which makes it difficult to ensure electrical connection to the common electrode layer 125. By contrast, with an angle larger than 120°, the auxiliary electrode layer 200 and the common electrode layer 125 break on the side of the contact hole 118b of the interlayer insulation layer 118, which makes it difficult for the auxiliary electrode layer 200 and the common electrode layer 125 to come into contact with each other. The oblique angle θ can be controlled by adjusting the amount of exposure at the time of forming the contact hole 118b because it coincides with the oblique angle of the side of the contact hole 118b. In addition, the connection recess 200b is formed such that it has a depth h ranging from 1 to 7 μm. The connection recess 200b is formed such that it has a diameter r ranging from 2 to 10 μm.

The configuration mentioned above makes the electron transport layer 124 to be disconnected (break at the step) in the connection recess 200b when it is formed on the auxiliary electrode layer 200. To be more specific, the electron transport layer 124 is formed, with the edges 124a1 and 124a2 (or the edges 124a3 and 124a4) arranged apart from each other, so that the contact surface 200c of the auxiliary electrode layer 200 exposes itself. The common electrode layer 125 is so formed as to come into contact with the contact surface 200c of the auxiliary electrode layer 200 and go around the space between the edges 124a1 and 124a2 (or the edges 124a3 and 124a4) of the electron transport layer 124.

The auxiliary electrode layer 200 is preferably formed by a sputtering method or a CVD method which forms a film that effectively covers the step. In this way, it is possible to form the interlayer insulation layer 118 which does not break on the side of the contact hole 118b. It is desirable that the auxiliary electrode layer 200 has a film thickness equal to or larger than 25 nm; an excessively thin film will break at the step even though it is formed by the foregoing method excellent in step coverage.

The electron transport layer 124 is preferably formed by vacuum deposition method so that it breaks at the step in the connection recess 200b and the contact surface 200c exposes itself, because the vacuum deposition method is comparatively poor in step coverage. The electron transport layer 124 preferably has a thickness equal to or larger than 10 nm. With an excessively small film thickness, it permits electrons to move directly from the common electrode layer 125 to the light-emitting layer 123 and hence it does not limit the injection of electrons into the light-emitting layer 123. On the other hand, the electron transport layer 124 with an excessively large thickness decreases in electron transmission and prevents breakage at the step. The electron transport layer 124 preferably has a thickness equal to or smaller than 40 nm so that it allows light to pass through with a minimum of attenuation and it breaks intentionally at the step in the connection recess 200b of the auxiliary electrode layer 200.

The common electrode layer 125 is preferably formed by a sputtering method or a CVD method so that it goes around that part (between the edges 124a1 and 124a2 and between the edges 124a3 and 124a4) for the electron transport layer 124 to break at the step. The sputtering method or the CVD method forms a film that effectively covers the step. The common electrode layer 125 preferably has a thickness equal to or greater than 25 nm; an excessively thin film is liable to breakage at the step. On the other hand, the common electrode layer 125 preferably has a thickness equal to or smaller than 300 nm; an excessively thick film causes the common electrode layer 125 to decrease in transmission.

1.7 Effect Produced by Display Panel 10

The following is a description of the effect produced by the display panel 10.

The display panel 10 includes the pixel electrode layer 119 in the pixel region on the substrate 100x, the auxiliary electrode layer 200 in the auxiliary region on the substrate 100x, the light-emitting layer 123 on the pixel electrode layer 119, the electron transport layer 124 on the light-emitting layer 123 and the auxiliary electrode layer 200, and the common electrode layer 125 on the electron transport layer 124. The auxiliary electrode layer 200 has the connection recess 200b formed thereon which has the contact surface 200c therein. The electron transport layer 124 has a nick which permits the contact surface 200c to expose itself in the connection recess 200b of the auxiliary electrode layer 200. The common electrode layer 125 is in direct contact with the contact surface 200c of the auxiliary electrode layer 200 in the nick of the electron transport layer 124.

The structure mentioned above causes the auxiliary electrode layer 200 to come into direct contact with the common electrode layer 125 without the electron transport layer 124 being interposed in the contact surface 200c. The result is a reduction in voltage drop due to the common electrode layer 125, an increased light-emission efficiency, a reduction in luminance decrease that otherwise occurs at the central part of the image plane, and a reduction in uneven luminance.

The connection recess 200b formed in the auxiliary electrode layer 200 causes the electron transport layer 200 to break at the step, which leads to direct contact between the common electrode layer 125 and the contact surface 200c of the auxiliary electrode layer 200 which exposes itself due to break at the step.

The structure mentioned above offers the advantage of obviating the necessity for deposition through a mask because the electron transport layer 124 is formed with the auxiliary electrode layer 200 kept away. The absence of deposition through a mask prevents productivity from reducing due to the accurate positioning of a meticulous mask.

The auxiliary electrode layer 200 is formed from the same material as used for the pixel electrode layer 119. The connection recess 200b of the auxiliary electrode layer 200 is formed in the same way as used for the connection recess (contact hole) 119c of the pixel electrode layer 119. The advantage is that the auxiliary electrode layer 200 can be formed in the same way as used for the pixel electrode layer 119 without the necessity for the exclusive step. This eliminates the possibility of productivity decreasing due to increased production steps.

1.8 Modified Embodiments

The foregoing is a description of the display panel 10 pertaining to the embodiment 1. The scope of the present disclosure is not restricted to the embodiment mentioned above except for the essential characteristic elements. The present disclosure embraces any modification to the embodiment which would be conceived by those skilled in the art or any embodiment which would be realized by combination of the elements disclosed in the embodiments within the scope of the present disclosure. The following is a description of a modified embodiment of the display panel 10.

The display panel 10 mentioned above is configured in that the electron transport layer 124 has a nick which permits the contact surface 200c to expose itself in the connection recess 200b of the auxiliary electrode layer 200, and that the common electrode layer 125 is so formed as to come into direct contact with the auxiliary electrode layer 200. However, the electron transport layer 124 may be modified in any way without being restricted as mentioned above. For example, the electron transport layer 124 may be formed in the following way. The electron transport layer 124 is partly made thinner equal to or less than 1 nm to such an extent that the part close to the contact surface 200c in the connection recess 200b of the auxiliary electrode layer 200 hardly becomes a nick (not illustrated in the figure). This structure permits the common electrode layer 125 to be electrically connected to the auxiliary electrode layer 200, with the electrical resistance lower than that of a part other than the thinned part. The result is that the electrical connection between the common electrode layer 125 and the auxiliary electrode layer 200 experiences reduced electrical resistance, which leads to improved light-emission efficiency and reduction in uneven luminance.

Figure 14A:
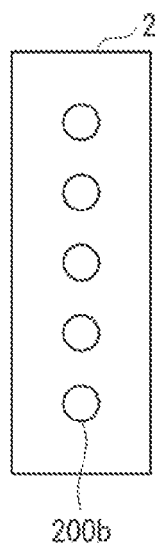
FIGS. 14A, 14B, 14C and 14D are diagrams illustrating a connection recess of the auxiliary electrode layer in its modified form.
Figure 14B:
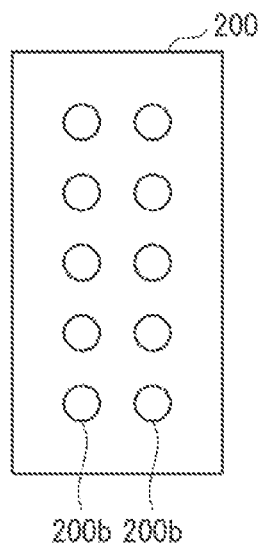
Figure 14C:
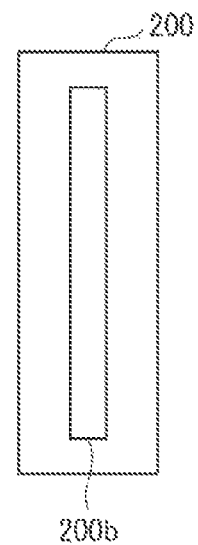
Figure 14D:
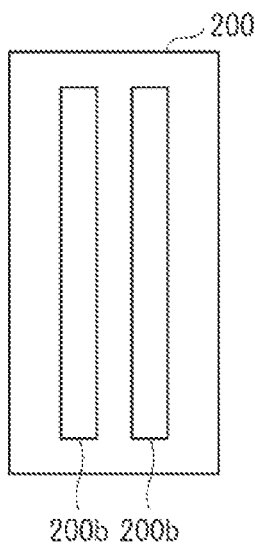

The display panel 10 mentioned above is constructed such that the connection recess 200b formed in the auxiliary electrode layer 200 is composed of elliptic recesses linearly arranged at predetermined intervals in the column direction as illustrated in FIG. 14A. However, the arrangement of the connection recess 200b may be modified as illustrated in FIG. 14B, with the recesses arranged along two or more parallel lines. Alternatively, the recess may be a slitlike one as illustrated in FIGS. 14C and 14D.

The display panel 10 mentioned above is constructed such that the light-emitting layer 123 continuously extends in the column direction on the row bank. However, this structure may be modified such that the light-emitting layer 123 exists intermittently for each pixel on the row bank.

The display panel 10 mentioned above is constructed such that the light-emitting layer 123 of the sub-pixel 100se arranged in the gap 522z between the adjoining column banks 522Y in the row direction emits light differing in color from its adjacent light-emitting layer, and such that the light-emitting layer 123 of the sub-pixel 100se arranged in the gap between the row banks 122X adjoining in the column direction emits light identical in color with its adjacent light-emitting layer. However, the structure mentioned above may be modified such that the light-emitting layers 123 of the sub-pixels 100se adjoining in the row direction emit lights identical in color and such that the light-emitting layers 123 of the sub-pixels 100se adjoining in the column direction emit lights differing in color from each other. Another modification may be possible in which the light-emitting layers 123 of the sub-pixels 100se which adjoin in the row and column directions emit lights differing in color from each other.

The display panel 10 pertaining to the embodiment mentioned above is constructed such that the pixel 100e includes three kinds of a red pixel, a green pixel, and a blue pixel. This structure is not intended to restrict the scope of the present disclosure. For example, the light-emitting layer emits light in one or four colors of red, green, blue, and yellow.

In addition, the embodiment mentioned above covers the structure in which the pixels 100e are arranged in matrix pattern. This structure is not intended to restrict the scope of the present disclosure. For example, it may be modified to produce the same effect such that the pixel regions are arranged in the column direction, with the adjoining gaps displaced by half a pitch, assuming that the distance between the pixel regions is regarded as one pitch. A zigzag arrangement eliminates uneven luminance, thereby improving the image quality of the display panel. This is because the film thickness fluctuation along a straight line (or a zigzag line) with a certain width looks like a belt in the case of the display panel for high-definition rendering which makes small displacement in the column direction practically invisible.

The display panel 10 according to the embodiment mentioned above is constructed such that the pixel electrode layer 119 and the common electrode layer 125 hold between them the hole injection layer 120, the hole transport layer 121, the light-emitting layer 123, and the electron transport layer 124. This structure does not restrict the scope of the present disclosure. A possible modification will be such that the pixel electrode layer 119 and the common electrode layer 125 hold between them the light-emitting layer 123 only, with omissions of the hole injection layer 120, the hole transport layer 121, and the electron transport layer 124. Another possible modification will be such that the display panel 10 has all or some of the hole injection layer, the hole transport layer, the electron transport layer, and the electron injection layer. Moreover, it is not always necessary to form all of these layers from organic compounds, but they may be formed from inorganic compounds.

According to the embodiment mentioned above, the light-emitting layer 123 is formed by the wet film-forming process, such as printing, spin coating, and ink jet printing. These processes are not intended to restrict the scope of the present disclosure. They may be replaced by a dry film-forming process such as vacuum deposition, electron beam deposition, sputtering, reactive sputtering, ion plating, and vapor phase growth method. Moreover, the members mentioned above may be formed from known materials appropriately.

The embodiment mentioned above employs the structure in which the EL element part has the pixel electrode layer 119 (which functions as the anode) at its lower part and the pixel electrode layer 119 is connected to the wiring 110 connected to the source electrode of the TFT. However, this structure may be modified such that the EL element part has the common electrode layer arranged at the lower part thereof and also has the anode arranged at the upper part thereof. In this case, the cathode arranged at the lower part is connected to the drain of the TFT.

The embodiment mentioned above is designed for the structure in which one sub-pixel 100se has two transistors Tr1 and Tr2. This embodiment is not intended to restrict the scope of the present disclosure. It may be modified such that one sub-pixel has one or three or more transistors.

Moreover, the embodiment mentioned above deals with the EL display panel of top emission type. This embodiment is not intended to restrict the scope of the present disclosure. It may also be applied to the display panel of bottom emission type, with individual constituents appropriately modified.

<<Supplements>>

The embodiment mentioned above merely illustrates a preferred example of the present disclosure. The scope of the present disclosure is not restricted by anything mentioned in the embodiment, such as numerals, shapes, materials, constituents, arrangement and connection for constituents, production steps, and sequence of steps. The embodiment deals with the constituents defined in the independent claim covering the highest concept, and those steps not mentioned in the independent claim will be treated as an optional constituents in the preferred embodiment.

The embodiment mentioned above illustrates the sequence of steps, which is merely intended to illustrate the present disclosure and may be modified in any way. The steps mentioned above may be carried out in any order; some steps may be carried out simultaneously with other steps.

For the present disclosure to be understood easily, the figures illustrating constituents in the embodiments may differ in scale from actual ones. The present disclosure is not restricted by the embodiments mentioned above but may be variously modified within the scope thereof.

The embodiments and modified embodiments mentioned above may have their functions partly combined together.

The embodiments mentioned above may be variously modified by those who are skilled in the art; and such modifications are embraced by the scope of the present disclosure.

The organic EL display panel and organic EL display apparatus according to the present disclosure will find use in a broad range of apparatuses such as television set, personal computer, and mobile phone and other electronic equipment having display panels.

The present disclosure contains subject matter related to that disclosed in Japanese Priority Patent Application JP 2017-023351 filed in the Japan Patent Office on Feb. 10, 2017, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. An organic electro luminescence (EL) display panel, comprising:
    a substrate;
    a plurality of pixel electrodes arranged in a matrix pattern on the substrate;
    a light-emitting layer comprising an organic light-emitting material formed on each pixel electrode of the plurality of pixel electrodes;
    a power supply auxiliary electrode layer configured to secure an electrode forming region which extends in a row direction or a column direction on at least one of gaps between the plurality of pixel electrodes adjoining to each other on the substrate in the row direction or the column direction and configured to be formed so as not to come into contact with a pixel electrode adjoining to the electrode forming region, wherein the plurality of pixel electrodes includes the pixel electrode adjoining to the electrode forming region;
    a functional layer configured to be formed so as to extend over the light-emitting layer and the power supply auxiliary electrode layer; and
    a common electrode layer configured to be formed so as to continuously extend on the functional layer, wherein
    the power supply auxiliary electrode layer has a recess denting toward the substrate,
    the functional layer has a thinned part on an inside wall of the recess of the power supply auxiliary electrode layer,
    the thinned part includes a nick,
    the common electrode layer is in direct contact with the power supply auxiliary electrode layer which exposes itself through the nick in the thinned part and is electrically connected to the power supply auxiliary electrode layer at a first part where the functional layer is thinned, and
    a resistance at the first part is lower than a resistance at a second part of the functional layer.

2. The organic EL display panel according to claim 1, wherein
    the electrode forming region on the substrate has a recess formed thereon, and
    the recess of the power supply auxiliary electrode layer is formed along the recess of the substrate.

3. The organic EL display panel according to claim 1, wherein the inside wall of the recess of the power supply auxiliary electrode layer and an upper surface of the substrate intersect with each other at an angle of 75° to 120°.

4. A method for producing an organic electro luminescence (EL) display panel having a substrate, a plurality of pixel electrodes arranged in a matrix pattern on the substrate, and a light-emitting layer comprising an organic light-emitting material formed on each pixel electrode of the plurality of pixel electrodes, the method comprising:
    securing an electrode forming region which extends in a row direction or a column direction on at least one of gaps between the plurality of pixel electrodes adjoining to each other on the substrate in the row direction or the column direction;
    forming, by a vapor phase growth method, a power supply auxiliary electrode layer having a recess denting toward the substrate in such a manner that the power supply auxiliary electrode layer is not in contact with a pixel electrode adjoining to the electrode forming region, wherein the plurality of pixel electrodes includes the pixel electrode adjoining to the electrode forming region;
    forming, by a vacuum deposition method, a functional layer extending over the light-emitting layer and the power supply auxiliary electrode layer in such a way that the functional layer has a thinned part on an inside wall of the recess of the power supply auxiliary electrode layer, wherein the thinned part includes a nick; and
    forming, by a sputtering method or a chemical vapor deposition method, a common electrode layer in such a way that the common electrode layer continuously extends on the functional layer, is in direct contact with the power supply auxiliary electrode layer which exposes itself through the nick in the thinned part, and is electrically connected to the power supply auxiliary electrode layer at a first part where the functional layer is thinned, wherein a resistance at the first part is lower than a resistance at a second part of the functional layer.

5. The method for producing the organic EL display panel according to claim 4, further comprising:
    forming a recess in the electrode forming region after preparing the substrate; and
    forming a recess of the power supply auxiliary electrode layer along the recess of the substrate by forming the power supply auxiliary electrode layer.

6. The method for producing the organic EL display panel according to claim 5, further comprising
    forming the recess in the electrode forming region in such a way that the inside wall of the recess of the power supply auxiliary electrode layer and an upper surface of the substrate intersect with each other at an angle of 75° to 120°.

* * * * *